(12) United States Patent
Atalar et al.

(10) Patent No.: US 11,740,301 B2
(45) Date of Patent: Aug. 29, 2023

(54) EIGENMODE TRANSMIT ARRAY COIL FOR MAGNETIC RESONANCE IMAGING

(71) Applicant: Bilkent University, Ankara (TR)

(72) Inventors: Ergin Atalar, Ankara (TR); Ehsan Kazemivalipour, Cambridge, MA (US)

(73) Assignee: Bilkent University, Ankara (TR)

( * ) Notice: Subject to any disclaimer, the term of this patent is extended or adjusted under 35 U.S.C. 154(b) by 34 days.

(21) Appl. No.: 17/384,393

(22) Filed: Jul. 23, 2021

(65) Prior Publication Data

US 2022/0026510 A1 Jan. 27, 2022

Related U.S. Application Data

(60) Provisional application No. 63/055,565, filed on Jul. 23, 2020.

(51) Int. Cl.
 *G01R 33/34* (2006.01)
 *G01R 33/561* (2006.01)
 *G01R 33/36* (2006.01)

(52) U.S. Cl.
 CPC . *G01R 33/34007* (2013.01); *G01R 33/34076* (2013.01); *G01R 33/365* (2013.01); *G01R 33/3628* (2013.01); *G01R 33/5611* (2013.01)

(58) Field of Classification Search
 CPC ........ G01R 33/34007; G01R 33/34076; G01R 33/3628; G01R 33/365; G01R 33/5611
 See application file for complete search history.

(56) References Cited

U.S. PATENT DOCUMENTS

| | | | | |
|---|---|---|---|---|
| 2011/0148215 A1* | 6/2011 | Marzetta | ................. | H02J 50/12 307/104 |
| 2012/0112748 A1* | 5/2012 | Hetherington | ....... | G01R 33/365 324/318 |
| 2012/0153951 A1* | 6/2012 | Kozlov | .............. | G01R 33/3628 324/322 |
| 2012/0169335 A1* | 7/2012 | Leussler | ............ | G01R 33/3628 333/32 |
| 2013/0165915 A1* | 6/2013 | Thiel | ...................... | A61B 90/57 606/41 |
| 2014/0139218 A1* | 5/2014 | Findeklee | .......... | G01R 33/3628 324/318 |
| 2017/0093364 A1* | 3/2017 | Shi | .......................... | H03H 7/40 |
| 2017/0299670 A1* | 10/2017 | Tramm | .............. | G01R 33/3628 |
| 2017/0359034 A1* | 12/2017 | Hussein | .................... | H03F 3/21 |
| 2018/0015294 A1* | 1/2018 | Anderson, Jr. | ........ | A61N 1/403 |
| 2020/0041587 A1* | 2/2020 | Findeklkee | ........ | G01R 33/3664 |
| 2022/0183630 A1* | 6/2022 | Nanaumi | ........... | G01R 33/5676 |

* cited by examiner

*Primary Examiner* — Dixomara Vargas
(74) *Attorney, Agent, or Firm* — Nelson Mullins Riley & Scarborough LLP; Anthony A. Laurentano

(57) ABSTRACT

A method of designing a coil array for use in a magnetic resonance imaging (MRI) system based on eigenmode analysis of a scattering matrix associated with the coil array is provided. The method includes determining a normalized reflected power generated by coils in the coil array in response to excitation thereof via at least one excitation signal, and adjusting one or more parameters of at least one of the coils so as to minimize the normalized reflected power.

25 Claims, 24 Drawing Sheets

8-channel

- $D_{Coil} = 315$ mm
- $H_{Coil} = 300$ mm
- $D_{Shield} = 412$ mm
- $H_{Shield} = 500$ mm
- $D_{Phantom} = 153$ mm
- $H_{Phantom} = 350$ mm
- $\sigma = 0.62$ S/m
- $\varepsilon_r = 80$

EIGENMODE TRANSMIT ARRAY COIL FOR MAGNETIC RESONANCE IMAGING

CROSS-REFERENCE TO RELATED APPLICATION

This application claims priority to U.S. Provisional Application No. 63/055,565 filed on Jul. 23, 2020. The aforementioned application is incorporated herein by reference in its entirety.

TECHNICAL FIELD

The present disclosure relates generally to a coil array for use in magnetic resonance imaging (MRI) systems, and more particularly to a transmit coil array for use in MRI systems, where the coil array is configured to be energized efficiently via application of electrical power thereto.

BACKGROUND

Magnetic resonance imaging (MRI) provides an image based on information obtained through resonance after exposing an atomic nucleus to a magnetic field. The resonance of an atomic nucleus refers to a phenomenon in which when a specific high frequency radiation is incident on the atomic nucleus magnetized by an external magnetic field, the atomic nucleus in a low energy state is excited to a high energy state by absorbing high frequency energy. The atomic nuclei have different resonance frequencies depending on their type and the resonance is influenced by an intensity of an external magnetic field. There are innumerable atomic nuclei inside a human body and hydrogen atomic nuclei are generally used for magnetic resonance imaging.

Transmit arrays (TxArrays) are being widely adopted for ultra-high field MRI systems to improve B i-field uniformity. These coils are also useful for conventional scanners by providing an additional degree of freedom, e.g., to enable RF shimming while trying to minimize local specific absorption rate (SAR), increase power efficiency, or implement implant-friendly modes.

High coupling between the coils of a TxArray coil array can cause extra losses leading to an increase in power consumption, which can become a major design issue. The problem of reducing inductive coupling between the coils can become more difficult to solve as the number of elements increases. For TxArrays in which the coils of the array exhibit some degree of inductive coupling, the active reflection efficiency, which is defined as a ratio of the total power reflected by the coils (herein also referred to as "the total reflected power") relative to the total power applied to the coils (herein also referred to as "the incident power") depends on the phases/amplitudes of power amplifiers, as well as on levels of impedance matching and decoupling. Although multiple studies have focused on optimizing the excitation profiles under multiple strict constraints including power consumption of TxArrays, special attention is needed to categorize the inputs based on the reflected power from TxArrays.

Further, a variety of methods for designing TxArrays in simulation environments have been proposed, such as a co-simulation strategy. The co-simulation strategy process replaces all lumped-components with equivalent lumped-ports, and calculates TxArrays multi-port scattering matrices, to be used for determining the optimal lumped components. However, for those TxArrays that are not manufactured with tight enough tolerances, the simulation results may not be able to predict actual measurements with a high probability, and therefore, special attention is needed to include the exact structure of fabricated TxArray in the design process. Co-simulation may also be used in this case, although it requires numerous measurements, especially for TxArrays with a large number of transmitting and lumped elements, to obtain the multi-port S-matrices, which are not practical.

SUMMARY

In one aspect, the present disclosure provides methods and systems for efficient coupling of applied electrical power to a transmit coil array employed in an MRI instrument. In embodiments, methods for designing the coil array can be based on an eigenmode analysis of a scattering matrix (S-matrix) to identify a set of inputs with higher power efficiencies. By way of example, a dual-row birdcage TxArray can be provided as an efficient and homogeneous coil for imaging at an RF excitation frequency of 123.2 MHz.

Unlike in the conventional systems, in embodiments of the design process of TxArrays according to the present teachings, the eigenmode analysis can be utilized to minimize the total reflected power for driving voltages by adjusting TxArray's free parameters instead of focusing solely on the impedance matching and decoupling levels.

In another aspect, the present disclosure provides methods for efficiently fabricating a TxArray that achieves a simulated optimal performance through iterative modeling. As discussed in more detail below, in embodiments, the TxArray can be simulated and designed using an eigenmode analysis of an S-matrix computed for a TxArray, and subsequently fabricated based on the parameters determined by the simulation. In some embodiments, the simulation process is carried out by adjusting and fine tuning capacitors of the coil.

Further, in some embodiments, subsequent to the fabrication of a TxArray based on design parameters obtained through the method of embodiments of the present teachings, through fine-tuning and matching the capacitor values, the fabricated TxArray can be effectively updated to achieve the simulated optimal performances.

In one aspect, a method of manufacturing a coil array for use in a magnetic resonance imaging (MRI) system includes determining a normalized reflected power generated by coils in the coil array in response to excitation thereof via at least one excitation signal; and adjusting one or more parameters of at least one of the coils so as to minimize the normalized reflected power, thereby arriving at design values for the parameters.

In some embodiments, the normalized reflected power can be determined as a function of the at least one excitation signal and a scattering matrix (S) associated with the coil array. The at least one excitation signal can include an excitation vector comprising one or more excitation signals each of which is associated with excitation of one coil of the coil array. Further, the excitation vector can be expanded as a linear combination of excitation eigenmodes of the coil array. For each of the excitation eigenmodes, a modal reflected power value can be determined. In some such embodiments, the step of determining the normalized reflected power can include computing a weighted sum of the modal reflected power values. In particular, the one or more parameters can be adjusted so as to increase a number of excitation eigenmodes that produces the modal reflected power value equal to or less than about 50%.

In some embodiments, the coil array can be fabricated based on the design values of the parameters. In some such embodiments, the method can include applying the excitation signal to the coil array to generate a magnetic field; directing the magnetic field on an object so as to allow the magnetic field to excite protons in the object; and detecting resulting excitation radio frequency (RF) from the object.

In some embodiments, the step of adjusting one or more parameters can include adjusting capacitor values of the coils and thus determining a capacitance matrix of the coil array.

In a related aspect, a method of fabricating a coil array for use in a magnetic resonance imaging (MRI) system can include (a) determining a first set of parameters for a first coil array,
wherein the first set of parameters are determined so as to minimize a normalized reflected power generated by coils in the first coil array in response to excitation thereof via at least one excitation signal; (b) fabricating the first coil array based on the first set of parameters; (c) measuring impedance values and constructing a first impedance matrix associated with the first coil array for one or more frequencies; (d) obtaining a first scattering matrix (S) associated with the first coil array; and (e) minimizing a first cost function for the first coil array by adjusting capacitor values of the coils and obtaining a second set of parameters for a second coil array.

In some embodiments, the method can also include (f) fabricating the second coil array based on the second set of parameters. In some embodiments, the steps (c) through (f) can be repeated more than one time.

In some embodiments, the method can further include applying at least one excitation signal to the coil array to generate a magnetic field; directing the magnetic field on an object so as to allow the magnetic field to excite protons in the object; and detecting resulting excitation radio frequency (RF) from the object.

In some embodiments, the cost function can be selected from the group consisting of:

$$\min_{\overline{c}} \frac{1}{N} \sum_{n=1}^{N} \lambda_n^2 + \lambda_{CP}^2,$$

$$\min_{\overline{c}} \frac{1}{N} \sum_{n=1}^{N} \lambda_n^2 + \lambda_{CP}^2$$

s.t. $\lambda_{CP} \leq 0.01$, and $$\min_{\overline{c}} \frac{1}{N} \sum_{n=1}^{N} \lambda_n^2,$$

where, $\overline{c}$ is a vector of capacitor values; N is a total number of channels; $\lambda_n$ is a vector of excitation eigenmodes; and $\lambda_{CP}$ is a vector of CP excitation.

In another related aspect, a transmit coil array for use in a magnetic resonance imaging (MRI) system can include one or more coils; one or more capacitors disposed between adjacent coils of the one or more coils; and a power supply configured to supply electrical power to the one or more coils. The one or more capacitors can be configured to reduce inductive coupling between the coils.

In some embodiments, the one or more capacitors can include a decoupling capacitor, $c_d^q$, configured to decouple neighboring coils; a tuning capacitor, $c_t^q$; a matching capacitor, $c_m^q$; and a series matching capacitor, $c_s^q$.

In some embodiments, one or more parameters of the coils can be configured such that a ratio of a total power reflected to a total power applied is minimized.

In some embodiments, the coil array can include n channels and can be configured to transmit m modes efficiently, where n is greater than m. Herein, transmitting "efficiently" can mean that the ratio of the total power reflected to the total power applied is equal to or less than about 50%. By way of example, transmitting "efficiently" can mean that the ratio is equal to or less than about 45%, about 40%, about 35%, about 30%, about 25%, about 20%, about 15%, about 10%, or about 5%.

In some embodiments, the parameters of the coils can be optimized for a circularly-polarized (CP) mode by adjusting a vector of capacitor values to minimize a cost function:

$$\sum_{n=1}^{N} (\alpha_n \lambda_n^2) + \alpha_{CP} \lambda_{CP}^2$$

where, N is a total number of channels; $\lambda_n$ is a vector of excitation eigenmodes; $\lambda_{CP}$ is a vector of CP excitation; and $\alpha_n$ and $\alpha_{CP}$ are weights for each term. In some such embodiments, $\alpha_n$ can be 1, and $\alpha_{CP}$ can be 0 or 1. In some embodiments, elements of $\lambda_{CP}$ can be limited to 0.01 or less.

In some embodiments, the transmit coil array can further include a radio frequency (RF) detector for detecting excitation radio frequency (RF) from an object.

In some embodiments, the transmit coil array can be fabricated by following steps of: fabricating a prototype coil array based on the one or more parameters; measuring impedance values and constructing an impedance matrix associated with the prototype coil array for one or more frequencies; obtaining a scattering matrix (S) associated with the prototype coil array; minimizing a cost function for the prototype coil array by adjusting capacitor values of the coils and obtaining a new set of one or more parameters; and fabricating the coil array in accordance with the new set of one or more parameters.

In another aspect, a computer-implemented method of designing a coil array for use in a magnetic resonance imaging (MRI) system can include calculating a normalized reflected power generated by coils in the coil array in response to excitation thereof via at least one excitation signal; adjusting one or more parameters of at least one of the coils so as to minimize the normalized reflected power, thereby arriving at design values for the parameters, wherein the at least one excitation signal comprises an excitation vector comprising one or more excitation signals each of which is associated with excitation of one coil of the coil array; expanding the excitation vector as a linear combination of excitation eigenmodes of the coil array; representing the normalized reflected power as a function of the at least one excitation signal and a scattering matrix (S) associated with the coil array; determining, for each of the excitation eigenmodes, a modal reflected power value, wherein the step of determining the normalized reflected power comprises computing a weighted sum of the modal reflected power values; and adjusting the one or more parameters so as to increase a number of excitation eigenmodes that produces the modal reflected power value equal to or less than about 50%.

According to embodiments of the present teachings, efficient operational modes can be obtained for transmit array (TxArray) coils using a general design technique based on the eigenmode analysis of the scattering matrix (S-matrix). The eigenmode analysis of the S-matrix can provide an efficient method for providing a quantitative and compact representation of the TxArray coils' power transmission capabilities. The eigenmode analysis of the S-matrix offers a simple, yet effective, tool for quantifying, comparing, and optimizing the performance of the TxArray coils. Further, using eigenmode analysis of the S-matrix, optimized TxArray coils can be designed and effectively fabricated, and the effects of fabrication error can be reduced.

In the eigenvalue analysis of the S-matrix according to embodiments of the present teachings, the ratio of the total reflected power from the TxArray coils relative to the total incident power for a given excitation signal corresponds to the weighted sum of the eigenvalues $S^H S$-matrix, where the superscript H denotes the Hermitian transpose. As such, the excitation space of TxArray coils can be increased with a low total reflection by minimizing the eigenvalues of $S^H S$-matrix.

In some embodiments, the present teachings also provide a method for designing RF transmit array coils based on the minimization of the total reflected power for certain modes of operations. In some embodiments, the present teachings can be employed to achieve a low total reflected power, e.g., a total reflected power less than about 80% or less than about 60% and preferably less than about 50%. By way of example, for some critical excitation modes, such as CP mode or a mode that generates maximum $B_1^+$ efficiency for a given region of interest, a total reflected power less than about 50% may be desired. It should be understood that one or more critical modes may be defined based on a particular application. Thus, in some cases, a critical mode for one application may be different than a critical mode for another application. In many embodiments, such low total reflected power can be achieved even with a high level of coupling between the coils, e.g., a coupling of equal to greater than −10 dB.

The maximum possible number of efficient modes can be found for a TxArray coil with an arbitrary number of channels by optimizing the free design parameters. Some examples of such design parameters can include, without limitation, capacitor values associated with the coils, the coil geometrical shape, coil size (e.g., coil diameter), and thickness of a wire employed for fabrication of the coils. Other design considerations may include the human body size, a region of interest for which an MRI image is desired. In some embodiments, the number of available channels may limit the free parameters.

DETAILED DESCRIPTION

Figure 1:
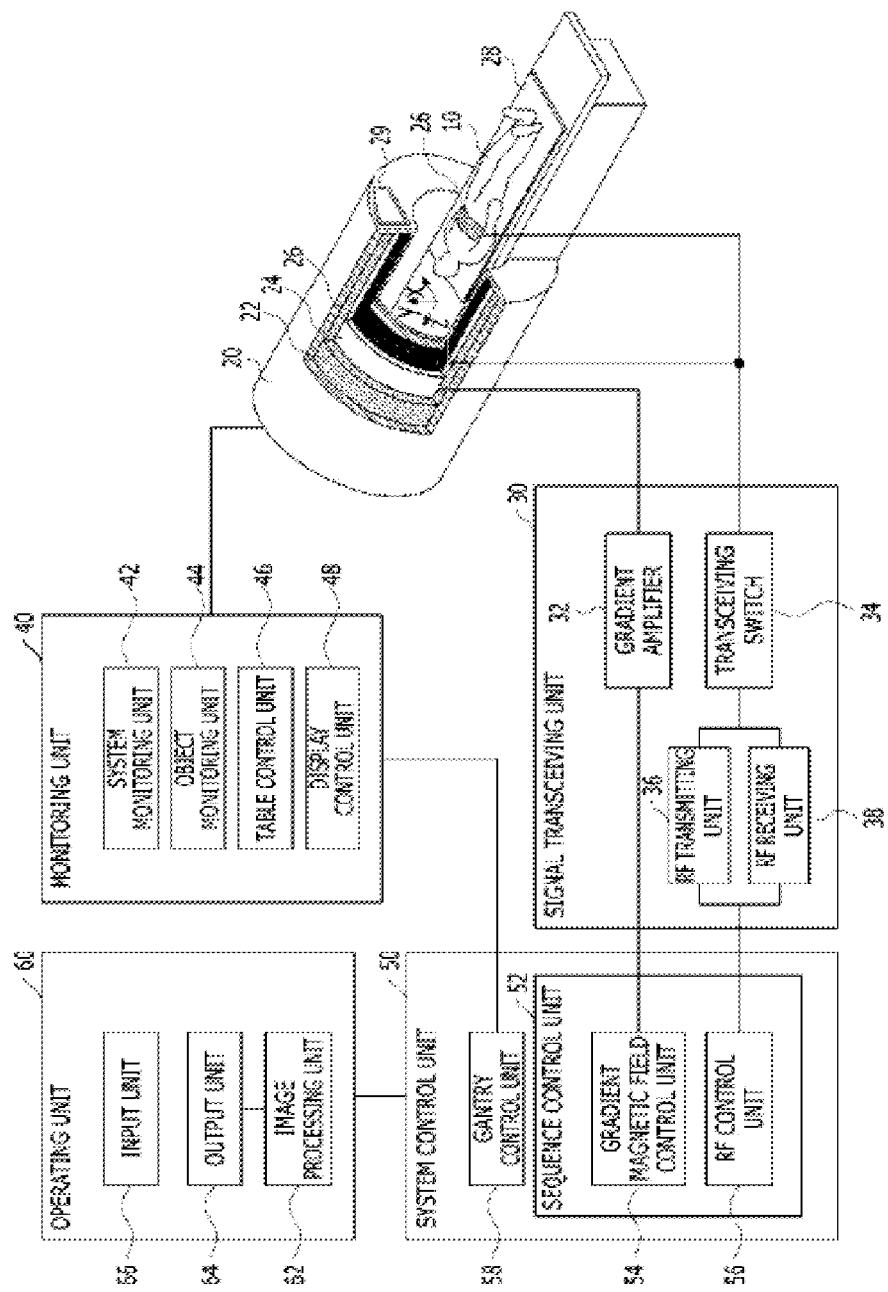
FIG. 1 is a block diagram illustrating a magnetic resonance imaging (MRI) system according to an embodiment of the present teachings.

Various embodiments will be now described with reference to drawings and like reference numerals are used to refer to like elements throughout all drawings. In the present specification, various descriptions are presented to provide appreciation of the present teachings. However, it is apparent that the embodiments can be executed without the specific description. In other examples, known structures and apparatuses are presented in a block diagram form in order to facilitate description of the embodiments.

Terms used in the present specification will be described in brief, and the present teachings will be described in detail. Terms used in the present teachings adopt general terms which are currently widely used as possible by considering functions in the present teachings, but the terms may be changed depending on an intention of those skilled in the art, a precedent, emergence of new technology, etc. Further, in a specific case, a term which an applicant arbitrarily selects is present and in this case, a meaning of the term will be disclosed in detail in a corresponding description part of the invention. Accordingly, a term used in the present teachings should be defined based on not just a name of the term but a meaning of the term and contents throughout the present teachings.

Further, throughout the specification, unless explicitly described to the contrary, the word "comprise" and variations such as "comprises" or "comprising", will be understood to imply the inclusion of stated elements but not the exclusion of any other elements. Further, the term "unit" used in the specification means software and/or hardware components such as FPGA or ASIC and the "unit" performs predetermined roles. However, the "unit" is not a meaning limited to software or hardware. The "unit" may be configured to reside on an addressable storage medium and may be configured to play back one or more processors.

Accordingly, as one example, the "unit" includes components such as software components, object oriented software components, class components, and task components, processes, functions, attributes, procedures, subroutines, segments of a program code, drivers, firmware, microcode, circuitry, data, databases, data structures, tables, arrays, and variables. Functions provided in the components and the "units" may be combined into a smaller number of components and "units" or further separated into additional components and "units."

An embodiment of the present teachings will be described more fully hereinafter with reference to the accompanying drawings so as to be easily implemented by those skilled in the art. In addition, a part which is not related with the description is omitted in order to clearly describe the present teachings in the drawings.

In the present specification, "image" may mean multi-dimensional data constituted by discrete image elements (e.g., pixels in a 2D image and voxels in a 3D image). For example, the image may include medical images of an object, which are acquired by X-ray, CT, MRI, ultrasonic waves, and other medical imaging systems, and the like.

Further, in the present specification, the "object" may include a person or an animal, or a part of the person or the animal. For example, the object may include organs including liver, heart, uterus, brain, breast, abdomen, and the like or a blood vessel. Further, the "object" may include a phantom. The phantom means a material that has a density of a living thing and a volume that is very proximate to an effective atomic number and can include a spherical phantom that has a similar property to a human body.

Further, in the present specification, a "user" as a medical specialist may be a doctor, a nurse, a medical technologist, a medical imaging expert, or the like and a technician repairing a medical apparatus, but is not limited thereto.

Further, in the present specification, the term "magnetic resonance imaging (MRI)" means an image for an object obtained using a nuclear magnetic resonance principle.

The MRI apparatus is an apparatus for acquiring an image of a single-layer portion of the object by expressing the intensity of a magnetic resonance (MR) signal for a radio frequency (RF) signal generated in a magnetic field of a specific intensity in contrast. For example, when the object is laid in a strong magnetic field and thereafter, the RF signal to resonate only a specific atomic nucleus (e.g., a hydrogen atomic nucleus, etc.) is irradiated to the object and stopped, the magnetic resonance signal is emitted from the specific atomic nucleus and the MRI apparatus may obtain an MR image by receiving the magnetic resonance signal. The magnetic resonance signal refers to the RF signal irradiated from the object. The magnitude of the magnetic resonance signal may be determined by the concentration of predetermined atoms (e.g., hydrogen, etc.) contained in the object, a relaxation time T1, a relaxation time T2, and a flow of a bloodstream.

The MRI apparatus includes features different from other imaging apparatuses. Unlike imaging apparatuses, such as CT, where acquisition of an image is dependent on a direction of detecting hardware, the MRI apparatus may acquire a two-dimensional image or a three-dimensional volumetric image directed to any point. Further, unlike CT, X-ray, PET, and SPECT, the MRI apparatus does not expose the object and an examinee to radiation, and may acquire an image having a high soft tissue contrast. Therefore, a neurological image, an intravascular image, a musculoskeletal image, and an oncologic image in which it is important to clearly describe an abnormal tissue may be obtained.

A three-dimensional volume of the object may include a three-dimensional shape of a person or animal, or part of the person or the animal. For example, the volume of the object may include the three-dimensional shape of organs including liver, heart, uterus, brain, breast, abdomen, and the like or a blood vessel, etc.

When the MRI apparatus intends to acquire information of the 3D volume of the object in a short time, it is possible to acquire a plurality of sheets of slice images in the direction of the slices constituting the 3D volume. When images of a plurality of slices are photographed, it is common to sequentially photograph the slice images as many as the slices, but taking the slice images sequentially may require a lot of time.

In a multi-slice scheme, when each slice image is acquired in a plurality of repetition time (TR) intervals, data for each slice is acquired in each TR interval in a cross direction to shorten a photographing time. For example, there is a dead time when the TR interval is much longer than an active time required for cross-section selection, phase encoding, and frequency encoding. In the multi-slice scheme, in order to obtain information on another cross section after obtaining information on one cross section in each TR interval, the dead time may be used.

In a simultaneous multi-slice (SMS) scheme, the plurality of slices are simultaneously excited to reduce a scan time to simultaneously acquire the magnetic resonance signals from the plurality of slices through a plurality of coils and a difference in coil sensitivity information which exists between the slices is used to separate the magnetic resonance signals for each slice. The coil sensitivity information may mean a sensitivity to receive different magnetic resonance signals depending on a location of each coil among the plurality of coils.

The simultaneous multi-slice scheme may correspond to parallel imaging, and the parallel imaging may include a sense scheme or a GRAPPA scheme.

FIG. 1 is a block diagram illustrating a magnetic resonance imaging system according to an embodiment of the present teachings. Referring to FIG. 1, a magnetic resonance imaging (MRI) system may include a gantry 20, a signal transceiver unit 30, a monitoring unit 40, a device control unit 50, and an operating unit 60.

The RF coil 26 may irradiate RF signals to a patient and receive magnetic resonance signals emitted from the patient. For example, the RF coil 26 may transmit an RF signal having a frequency equal to a frequency of a processional motion toward the atomic nucleus which performs the processional motion to the patient and thereafter, stop transmission of the RF signal and receive the magnetic resonance signal emitted from the patient.

For example, the RF coil 26 may generate an electromagnetic signal, having a radio frequency corresponding to the type of atomic nucleus, for example, an RF signal, and apply the generated RF signal to the object 10 so as to transition a certain atomic nucleus from a low energy state to a high energy state. When the electromagnetic signal generated by the RF coil 26 is applied to the certain atomic nucleus, the certain atomic nucleus may transition from the low energy state to the high energy state. Thereafter, when the electromagnetic wave generated by the RF coil 26 is removed, the atomic nucleus to which the electromagnetic wave has been applied may emit electromagnetic waves having a Larmor frequency while transiting from the high energy state to the low energy state. In other words, when the application of the electromagnetic signal to the atomic nucleus is interrupted, while an energy level from high energy to low energy is changed in the atomic nucleus to which the electromagnetic wave is applied is changed, the electromagnetic wave having the Larmor frequency may be emitted. Here, the Larmor frequency may mean a frequency at which magnetic resonance is induced in the atomic nucleus.

The RF coil 26 may receive the electromagnetic signals irradiated from the atomic nuclei inside the object 10. The RF coil 26 may be implemented as one RF transceiver coil having both a function of generating the electromagnetic wave having the radio frequency corresponding to the type of the atomic nucleus and a function of receiving the electromagnetic waves irradiated from the atomic nucleus.

Further, the RF coil 26 may be implemented as each of a transmission RF coil having the function of generating the electromagnetic wave having the radio frequency corresponding to the type of atomic nucleus and a reception RF coil having the function of receiving the electromagnetic wave irradiated from the atomic nucleus.

Further, the RF coil 26 may be fixed to the gantry 20 and may be removable. The removable RF coil 26 may include RF coils for a portion of the object including a head RF coil, a thorax RF coil, a leg RF coil, a neck RF coil, a shoulder RF coil, a wrist RF coil, and an ankle RF coil. Further, the RF coil 26 may communicate with an external device by a wired and/or wireless manner and may perform even dual tune communication according to a communication frequency band.

In addition, the RF coil 26 may include a birdcage coil, a surface coil, a transverse electromagnetic coil (TEM coil), and a dual-row coil according to a structure of the coil. In addition, the RF coil 26 may include a transmission-only coil, a reception-only coil, and a transmission/reception-combination coil according to a method of transceiving the RF signal. Further, the RF coil 26 may include RF coils of various channels such as 8 channels, 16 channels, 32 channels, 72 channels, and 144 channels.

The RF transmitting unit 36 and the RF receiving unit 38 may drive the RF coil 26. The RF transmitting unit 36 may supply the RF pulse of the Larmor frequency to the RF coil 26 and the RF receiving unit 38 may receive the magnetic resonance signal received by the RF coil 26.

According to embodiments of the present teachings, the RF coil 26 may be implemented as a transmit array (TxArray) coil, and hereinbelow, "TxArray coil" will be interchangeably used with RF coil 26.

An aspect of the present teachings relates to configuring a digital data processor to compute excitation eigenmodes of a TxArray coil to achieve a quantitative and compact representation of a TxArray coil's transmission capabilities. For a given set of excitation signals, the total power transmitted to a TxArray coil can be analyzed using its scattering matrix (S-matrix), which can be determined as a relationship between the incident waves and the reflected waves. The eigenmode analysis of S-matrix enables fabrication of a TxArray coil exhibiting a low level of reflected power with respect to the excitation signal. Accordingly, the present teachings offer a simple tool for quantifying, comparing, and optimizing the performance of the TxArray coils for a magnetic resonance imaging (MRI) system.

An idealized TxArray coil array would exhibit a zero total reflected power for all incident waves, which requires a zero S-matrix (i.e., an S-matrix with all of its components being zero).

Due to practical limitations and imperfections in impedance matching and decoupling of the coils, S-matrix cannot be a null matrix (i.e., a matrix with zero elements). However, the S-matrix elements can be minimized by adjusting the geometrical parameters or capacitor values (herein interchangeably used with "capacitance") of the coils using an optimization process. Such an optimization process may affect the performance of the coil array. The vast majority of prior art studies concentrated on minimizing the magnitude of S-matrix elements without considering the excitation signals.

However, the present inventors have recognized excitation signals play a significant role in determining the total transmitted and reflected power levels. In other words, for a given TxArray coil, the reflection can be high for some excitation signals but low for some others.

In embodiments of the present teachings, an eigenmode analysis, which treats the S-matrix as a whole, can be utilized instead of considering the individual elements of the S-matrix. The present teachings can minimize the total reflected power for a greater range of excitation signals by adjusting the TxArray coil design parameters. The design strategy according to embodiments provide methods for minimizing the total reflected power for excitation signals, even for TxArray coils with a nonzero S-matrix.

Figure 2:
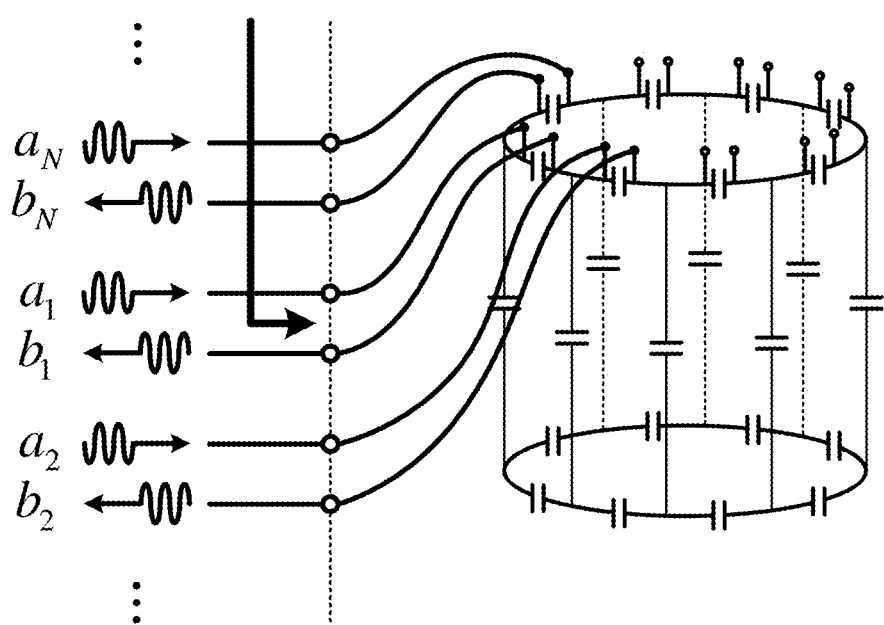
FIG. 2 depicts a schematic of a transmit coil array for use in the MRI system according to the present teachings.

FIG. 2 shows a schematic of a transmit coil array for use in an MRI system according to the present teachings. For a TxArray coil, the S-matrix can be defined as the relationship between vectors associated with incident and reflected waves, herein referred to, respectively, as a and b vectors. Under such representation, the net transmitted power can be quantified as the difference between the total incident power and total reflected power.

Figure 3:
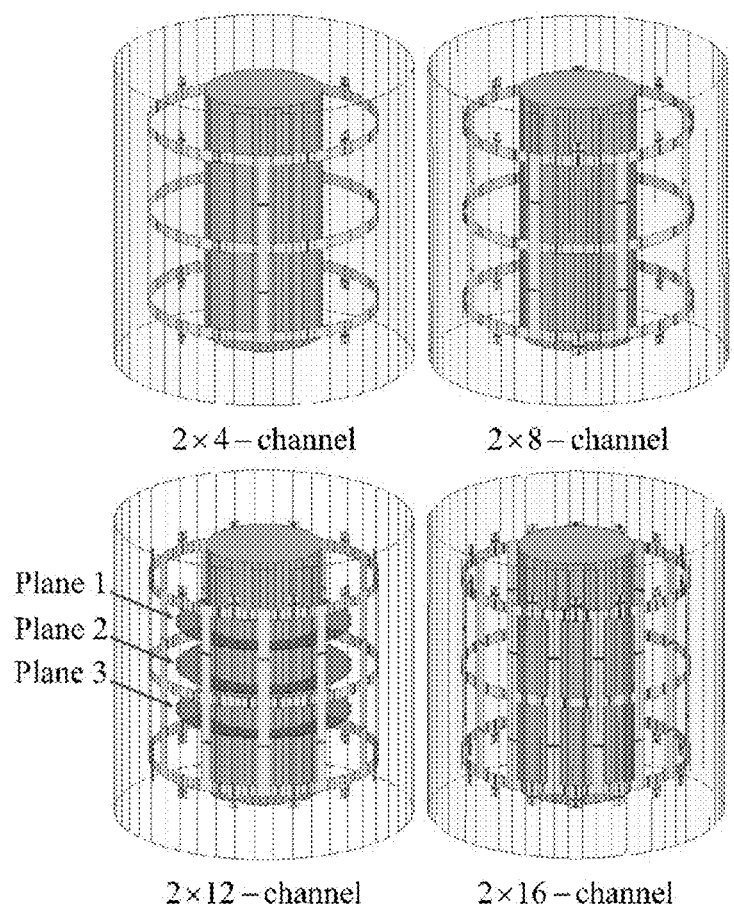
FIG. 3 schematically depicts four different dual-row (2×C-channel) TxArray coil models that are used for simulations in the present teachings.

Throughout the specification, various simulation results and experiment results will be provided for four dual-row TxArray coils with a different number of channels, as shown in FIG. 3, for use in 3 tesla (T) scanners. It should be understood that the present teachings can be employed in other types of MRI scanners as well. In some cases, the coils according to various embodiment may replace the conventional body coils since they can perform similarly to the traditional birdcage coils when they are driven in the circularly polarized (CP) form, and can also provide additional degrees of freedom.

In embodiments, the S-matrix describing a TxArray coil characterizes the power interactions between the input ports of the TxArray coil. For a general TxArray coil consisting of N transmit elements, the S-matrix can be represented as b=Sa, where a and b are the vectors of the incident and reflected waves, respectively, and are defined as:

$$a = \frac{1}{2\sqrt{|R\{Z_0\}|}}(V + Z_0 I) \text{ and} \quad (1)$$

$$b = \frac{1}{2\sqrt{|R\{Z_0\}|}}(V - Z_0^* I)$$

where V and I are the vectors of root-mean-square port voltages and currents; and $Z_0$ is the reference impedance, which is chosen as 50 ohms as an example in the present disclosure. With this formulation, the total average power transmitted to a TxArray coil with lossless transmission lines can be written as:

$$P_t^T = a^H a - b^H b = a^H (U - S^H S) a \quad (2)$$

where the superscript H denotes the Hermitian (conjugate) transpose; and U denotes the identity matrix. Equation 2 expresses the net transmitted power as the difference between the incident power and the reflected power, which can be quantified as $P_i^T = a^H a$ and $P_r^T = b^H b$, respectively. An idealized coil would have 100% transmitted power and no reflected power. However, an idealized coil cannot be achieved in reality due to, for example, the inductive coupling of the transmit coil elements. Herein, a normalized reflected power is defined as a ratio of the total reflected power to the total incident power, and can be characterized as a function of the excitations and S-matrix as follows:

$$\lambda(a) = \frac{P_r^T}{P_i^T} = \frac{b^H b}{a^H a} = \frac{a^H S^H S a}{a^H a} \quad (3)$$

As such, in order to ensure high transmit efficiency, $\lambda(a)$ can be minimized. More specifically, examining $S^H S$ can provide information on the total incident and reflected power of a TxArray coil. $S^H S$ is a Hermitian matrix, and hence is diagonalizable by a unitary similarity transformation. That is, $$S^H S = Q \Lambda Q^H \quad (4)$$

where Q is a unitary matrix (i.e., $QQ^H = Q^H Q = U$) formed by the eigenvectors ($q_n$) of $S^H S$, and $\Lambda$ is a diagonal matrix formed by the eigenvalues ($\lambda_n$) of $S^H S$.

Since $[S^H S] q_n = \lambda_n q_n$, if the TxArray coil is excited in such a way that the vector of the incident waves is equal to the nth eigenvector of $S^H S$, i.e., $a = q_n$, then the normalized reflected power yields:

$$\lambda(a = q_n) = \frac{b^H b}{a^H a} = \frac{q_n^H S^H S q_n}{q_n^H q_n} = \frac{q_n^H \lambda_n q_n}{q_n^H q_n} = \lambda_n \quad (5)$$

It should be noted that all eigenvalues are positive real numbers with values less than or equal to one. The eigenvectors of $S^H S$ are orthogonal and represent the excitation vectors of the TxArray coil. Therefore, they can be called "excitation eigenmodes" of the TxArray coil, and the eigenvalues of $S^H S$ can be called "modal reflected power" values of the TxArray coil. The normalized reflected power in the case of an arbitrary vector of incident waves, which can be uniquely expanded as a sum of the distinct eigenmodes, i.e., $\alpha = \sum_{n=1}^{N} w_n q_n = Qw$, where $w = [w_1 \ w_2 \ \ldots \ w_N]^T$ is the vector of the expansion coefficients, and can be expressed as follows:

$$\lambda(a) = \frac{a^H [S^H S] a}{a^H a} = \quad (6)$$

$$\frac{w^H Q^H S^H S Q w}{w^H Q^H Q w} = \frac{w^H Q^H Q \Lambda Q^H Q w}{w^H Q^H Q w} = \frac{w^H \Lambda w}{w^H w} = \sum_{n=1}^{N} \left(\lambda_n \left(\frac{w_n}{|w|}\right)^2\right)$$

Equation 6 shows that the normalized reflected power can be represented as the normalized weighted sum of the modal reflected power values. Since the form of $\lambda(a)$ is a Rayleigh quotient, its values are always between the smallest and largest $\lambda_n$ values. To obtain an ideal TxArray coil with zero total reflected power for any arbitrary inputs, all eigenvalues of $S^H S$ must be zero, which is not practical. However, the parameters in determining $S^H S$ can be adjusted to minimize all eigenvalues and achieve a minimal total reflected power over a broader set of incident waves.

λ-Opt Design Strategy

Embodiments of the present teachings employ a method of designing TxArray coils based on the minimization of the normalized reflected power by adjusting the capacitor values of TxArray coils (herein also referred to as "λ-opt"). For example, some embodiments minimize the normalized reflected power for excitation eigenmodes as well as for the CP excitation vector, i.e., $\lambda_{CP}$. Minimizing $\lambda_{CP}$ provides the opportunity to construct the CP mode from the most efficient excitation eigenmodes. In some embodiments, the optimization problem can be formulated as:

$$\lambda\text{-}opt: \min_{\bar{c}} \sum_{n=1}^{N} (\alpha_n \lambda_n^2) + \alpha_{CP} \lambda_{CP}^2 \quad (7)$$

where $\bar{c}$ is the vector of the capacitor values; and N is the total number of channels, and $\alpha_n$ and $\alpha_{CP}$ represent the weights for each term. One or more constraints can be applied to Equation 7 to obtain desired modes of operations. By way of example, the following three cases can be investigated for this general λ-opt formulation:

$$\text{case\#1} \min_{\bar{c}} \frac{1}{N} \sum_{n=1}^{N} \lambda_n^2 + \lambda_{CP}^2 \quad (8)$$

$$\lambda\text{-}opt: \text{case\#2} \min_{\bar{c}} \frac{1}{N} \sum_{n=1}^{N} \lambda_n^2 + \lambda_{CP}^2$$

$$\text{s.t. } \lambda_{CP} \leq 0.01$$

$$\text{case\#3} \min_{\bar{c}} \frac{1}{N} \sum_{n=1}^{N} \lambda_n^2$$

In embodiments of the present teachings, these three different minimization cases can be employed as examples to investigate the impact of added constraint and weighting coefficients on the optimization performance. However, the present teachings are not limited thereto, and various other constraints can be applied as the optimization conditions.

To evaluate the performance of the λ-opt strategy, a minimization strategy based on minimizing the S-matrix elements (S-opt) can be employed as a reference. For this, the difference between the actual and desired S-matrices can be minimized. By way of example, methods described in Kozlov et al. ("Effects of Tuning Conditions on Near Field of MRI Transmit Birdcage Coil at 64 MHz", IEEE Eng Med Bio. 2016), which is herein incorporated by reference in its entirety can be employed as informed by the present teachings.

For example, the S-opt criterion can be formulated as:

$$S\text{-}opt: \min_{\bar{c}} \frac{1}{N} \sum_{n=1}^{N} \sum_{m=1}^{N} |s_{mn}|^2 \quad (9)$$

$$\text{s.t. } |s_{nn}| \leq -15 \text{ dB}$$

The added constraint poses an upper limit on the magnitudes of the reflection coefficients. Note that $\Sigma_n{}^N = \Sigma_{m=1}{}^N |S_{mn}|^2$, which is equal to the trace of $S^H S$, can also be calculated as the summation of the $\lambda_n$ values. Therefore, the S-opt approach minimizes the average of the $\lambda_n$ values, while limiting the reflection coefficients to be equal to or less than a predetermined level, in this case, −15 dB.

RF TxArray Coil Model

Schematic models of dual-row (2×C-channel) head TxArray coils are shown in FIG. 3. In this example, the coils have a cylindrical geometry, include 2C transmit loops with the same dimensional sizes distributed in both the circumferential direction and the z-direction, and can be decoupled by adjusting the decoupling capacitors disposed between adjacent loops.

Figure 4:
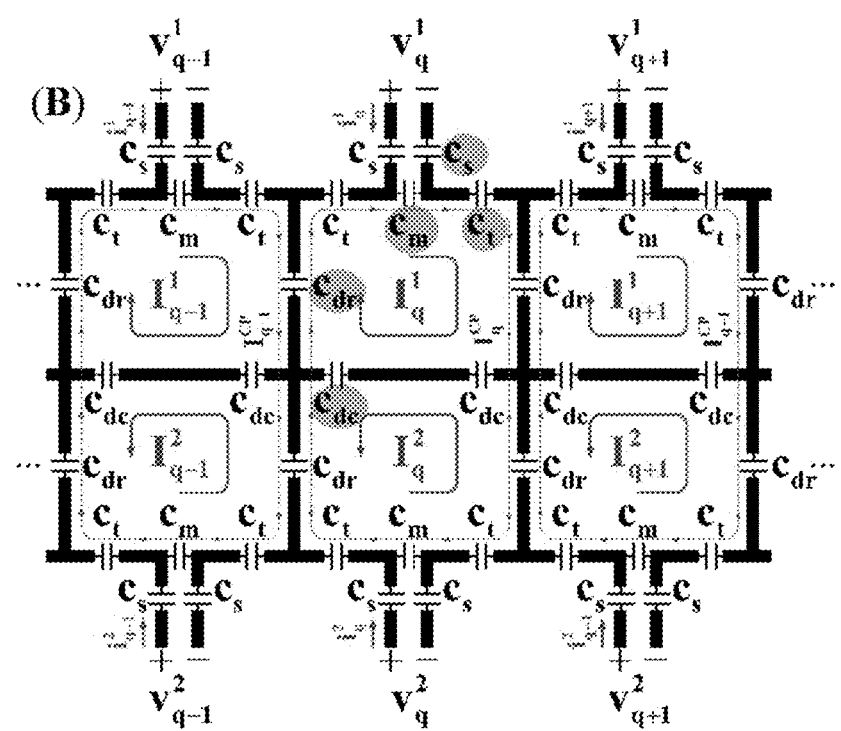
FIG. 4 shows a circuit model for a dual-row TxArray coil used for simulations in the present teachings.

As shown in FIG. 4, in each loop, five distinct capacitor values, i.e., $\bar{c} = [c_{dr}\ c_{dc}\ c_t\ c_m\ c_s]$, mainly govern the performance of the TxArray coils as free design parameters. The chosen structure for the dual-row TxArray coil enables the coils to act like a single-row degenerate birdcage TxArray coil as the mesh currents of the adjacent elements in the axial direction cancel each other in the mid-ring segments of the coil.

In the CP excitation mode, both rows are individually excited with identical power and linearly increasing phases, and the lower-row channels are excited with a 180° phase shift relative to the upper-row channels. When the CP excitation is applied to this TxArray coils, it produces a field similar to a conventional birdcage coil with a uniform $B_1^+$ field distribution in a large field-of-view. The degree of uniformity of the $B_1^+$ field distribution can be quantified in several ways. For example, the maximum deviation of the field's magnitude from the mean magnitude of the field in a given region of interest can be indicative of the degree of non-uniformity of the field. In other words, as the difference between the maximum field magnitude and the mean field magnitude decreases, the uniformity of the field increases. Standard deviation within the volume of interest can be employed as another way of reporting non-uniformity.

Numerical Simulations

Figure 5B:
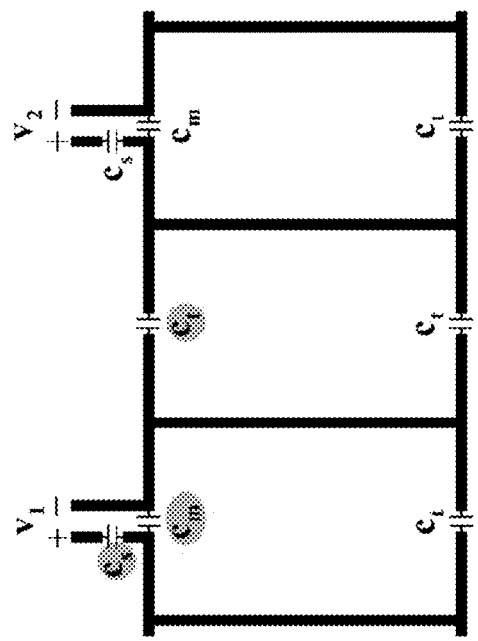
FIG. 5B shows a circuit model for a high-pass birdcage coil for comparison with the dual-row coil models of the present teachings.
Figure 5A:
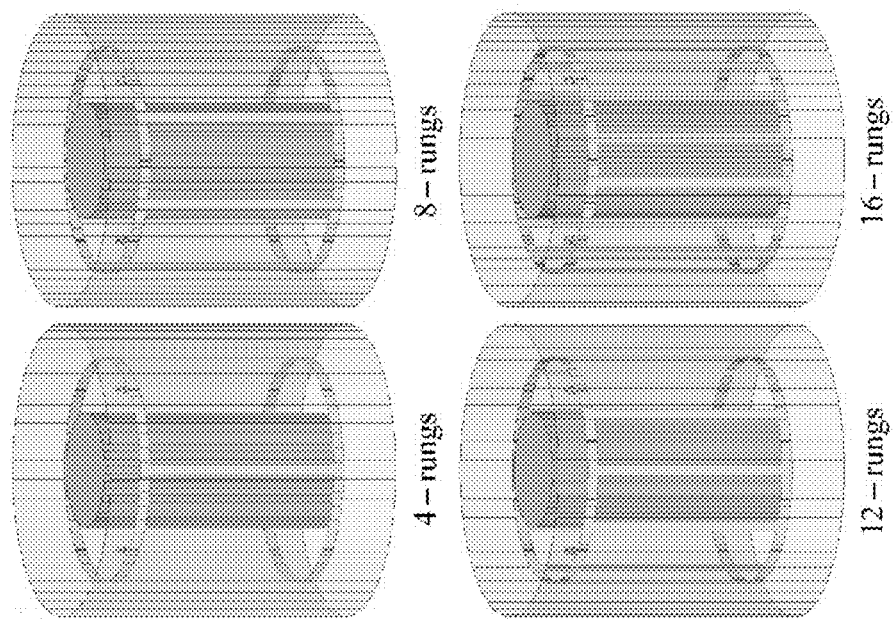
FIG. 5A shows four high-pass birdcage coil models for comparison with the dual-row coil models of the present teachings.

Four shielded dual-row TxArray coils at 3T (i.e., a B0 field of 3 tesla, which then determines the B1+ field) with 4, 8, 12, and 16 transmit channels in each row, as shown in FIGS. 3 and 4, were designed and simulated. Further, four high-pass birdcage coils at 3T composed of 4, 8, 12, and 16 rungs, as shown in FIGS. 5A and 5B, were simulated to compare the $B_1^+$ patterns of the TxArray coils in the CP excitation mode with the traditional birdcage coils. The birdcage coils were driven in the quadrature mode.

In this example, all TxArray coils and birdcage coils were modeled as a cylindrical geometry with the same dimensions (diameter of 315 mm, length of 270 mm, shield diameter of 408.9 mm, and shield length of 420 mm). All rings and legs were modeled to be formed of copper strips with a width of 15 mm. All coils shown in FIGS. 3 and 4 were modeled as being loaded with a uniform cylindrical phantom with a diameter of 160 mm, a length of 350 mm, a conductivity of 0.6 S/m, and a relative permittivity of 80.

ANSYS Electronics Desktop (ANSYS Inc., Canonsburg, Pa., USA) was used to implement the numerical simulations at the operation frequency of 123.2 MHz. The conductors were modeled as good conductors and the finite conductivity boundary was defined therefor. Some examples of good conductors for use in the practice of various embodiments of the present teachings include, without limitation, gold and copper. Further, capacitors were adjusted based on the optimization method described above, using a combined finite element method and circuit analysis approach. By substitution of all capacitors with equivalent lumped ports, the multiport S-matrices of the loaded TxArray coils were calculated in ANSYS HFSS. The multiport S-matrices were applied to perform the minimization problem, which was implemented in a custom-written MATLAB script, and the optimal values of the capacitors were obtained. Subsequently, the multiport S-matrices were exported to ANSYS Designer. The updated port current and voltage values were pushed back to ANSYS HFSS to calculate the distributions of the electric and magnetic fields.

The capacitor values of the 2×4-channel TxArray coil were obtained based on the λ-opt method discussed above. The λ-opt (case #1) method was also used to determine the coil performance as a function of the number of channels. To evaluate the performance of the optimization strategy according to the present teachings, both the λ-opt (case #1) and S-opt approaches were employed in the case of a 2×8-channel TxArray coil. The capacitor values of the TxArray coils and the high-pass birdcage coils as a result of the simulation are listed in Table 1 below.

TABLE 1

Optimized capacitor values for the simulated TxArray coils and high-pass birdcage coils

| | Dual-row TxArray coils | | | | | | |
|---|---|---|---|---|---|---|---|
| | 2 × 4-channel | | | 2 × 8-channel | | 2 × 12-channel | 2 × 16-channel |
| | λ-opt | | | λ-opt | | λ-opt | λ-opt |
| Capacitors | case#1 | case#2 | case#3 | case#1 | S-opt | case#1 | case#1 |
| $c_{dr}$ | 25.8 pF | 25.8 pF | 25.9 pF | 41.2 pF | 41 pF | 43.5 pF | 50.6 pF |

TABLE 1-continued

Optimized capacitor values for the simulated TxArray coils and high-pass birdcage coils

| | | | | | | | |
|---|---|---|---|---|---|---|---|
| $c_{dc}$ | 13.9 pF | 14 pF | 13.9 pF | 27 pF | 27.8 pF | 39.9 pF | 45.6 pF |
| $c_t$ | 13 pF | 16 pF | 12.8 pF | 97.9 pF | 29.3 pF | 112.2 pF | 161.8 pF |
| $c_m$ | 61.9 pF | 25.2 pF | 70.9 pF | 18.1 pF | 33.8 pF | 31.1 pF | 42 pF |
| $c_s$ | 65.7 pF | 22.5 pF | 70.2 pF | 7.7 pF | 23 pF | 12 pF | 13.2 pF |

High-pass birdcage coils

| Capacitors | 4-rung | 8-rung | 12-rung | 16-rung |
|---|---|---|---|---|
| $c_t$ | 4.66 pF | 13.36 pF | 22.7 pF | 32.27 pF |
| $c_m$ | 0.97 pF | 3.68 pF | 8 pF | 13.46 pF |
| $c_s$ | 3.77 pF | 10.36 pF | 20.03 pF | 28.34 pF |

To obtain more information about the total transmitted power to each TxArray coil, the power loss in phantom and conductors, including the power-loss in the shield, were calculated. The capacitors were assumed to be lossless. The radiation loss was calculated as the difference between the total transmitted power and all other losses.

The $B_1^+$ efficiency was evaluated as the average $B_1^+$ within a region of interest for a unit total incident power. For comparison of the performance of the coils, the electromagnetic fields were computed from three different axial planes that pass through the phantom, as shown in FIG. 3.

Coil Construction

Figure 6:
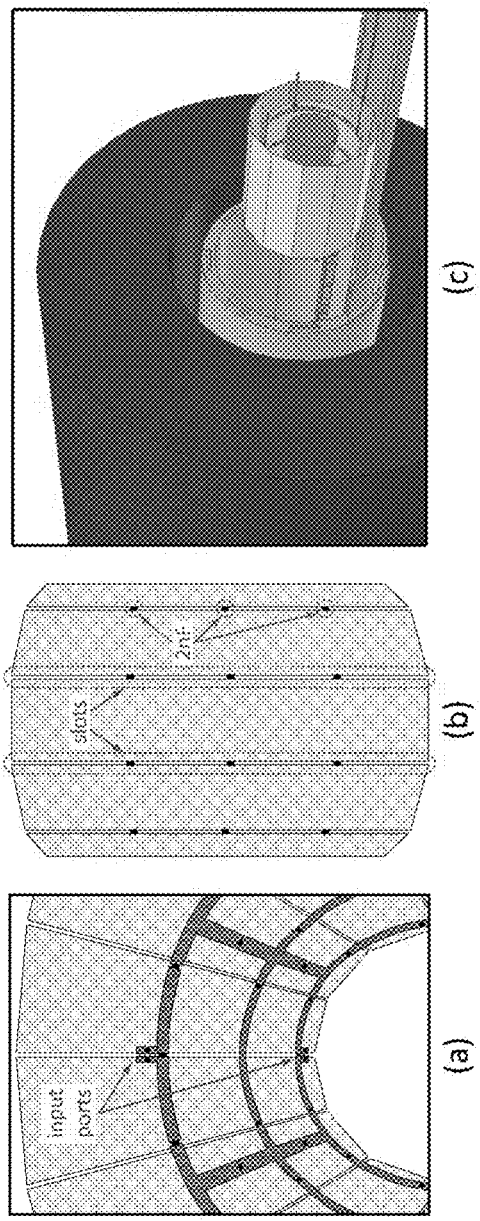
FIG. 6 shows an example of a fabricated 2×4 channel transmit array coil according to the present teachings.

To validate the simulations, the structure of a 2×4-channel TxArray coil, which was supported by cylindrical plexiglass with a thickness of 3 mm and an outer diameter of 315 mm was constructed, as shown in FIG. 6. The length of the coil was 270 mm, and all rings and legs were made of copper strips with a width of 15 mm. The coil's copper was divided into 56 different sections to distribute the capacitors. Due to practical limitations, the shield was built on another plexiglass in the shape of a right regular dodecagonal prism (See panel (b) of FIG. 6). The shield was also constructed of copper strips on the outer side of the frame, and slits in 12 equally spaced rectangular sections were constructed with dimensions of 105.5×480 mm² along the axial direction to reduce gradient-induced eddy currents. The adjacent slits were connected with three 2 nF capacitors at positions that face rings of the coil. The strip thickness in both the coil and the shield was 35 µm. The coil was loaded with a cylindrical SNR phantom (3.7 g/L $NiCl_2.6H_2O$ and 2.4 g/L NaCl) with a diameter of 153 mm. Magnetic resonance electrical properties tomography (MREPT) was used to measure the conductivity of the phantom as 0.62 S/m. Its relative permittivity was assumed to be equivalent to that of water.

To estimate the capacitor values needed for the fabricated coil, an identical loaded 2×4-channel TxArray coil, which was assumed to have the same 2 nF capacitors on its shield, was simulated. The capacitor values were obtained using the λ-opt (case #1) method and shown in Table 2 below.

TABLE 2

Optimized capacitor values for the fabricated and simulated 2 × 4-channel TxArray coils

| Capacitors | $c_{dr}$ | $c_{dc}$ | $c_t$ | $c_m$ | $c_s$ |
|---|---|---|---|---|---|
| Fabricated TxArray coil | 25.7 pF ± 0.2 pF | 14.6 pF ± 0.2 pF | 14.6 pF ± 0.2 pF | 51.6 pF ± 0.2 pF | 51.9 pF ± 0.2 pF |
| Simulated TxArray coil | 26.4 pF | 14.1 pF | 13.3 pF | 56.6 pF | 57 pF |

A calibrated Agilent E5061B vector network analyzer was used to measure the scattering parameters of the coil. All MR experiments were conducted using a 3T scanner (Magnetom Trio A Tim, Siemens Healthcare, Erlangen, Germany) equipped with 8 transmit array channels. Each channel utilized a separate amplifier (Analogic Corp., Boston, Mass., USA) with adjustable power output with maximum peak power of 8 kW. Accordingly, eight coaxial cables with adjusted bazooka baluns were used to carry the RF power from the amplifiers to the TxArray coil. The TxArray coil was utilized only in the transmit mode. A Siemens body-matrix coil, which is a 6-channel standard flexible surface coil with six integrated preamplifiers, was used as the receive coil. The images were acquired using a gradient echo (GRE) pulse sequence with FA=25.3°, TR/TE=100 ms/8 ms, in-plane resolution=2.3 mm, slice thickness=5 mm.

Simulation Results

The performance of all four TxArray coils at 123.2 MHz tuned by the different minimization approaches is summarized in Table 3 below. In Table 3, all the $\lambda_n$ values, $\lambda_{CP}$), reflection coefficients, and maximum coupling levels, and $B_1^+$ efficiencies in the CP excitation mode are provided for different solutions. The simulation results based on the λ-opt (case #1) approach showed that the ability to match and decouple the TxArray coils decreased as the number of transmit channels increased, indicated by an increase in the average of modal reflected power values, $\lambda_{av}$. Note that this value was also equal to $$\frac{1}{N}\sum_{n=1}^{N}\sum_{m=1}^{N}|s_{mn}|^2.$$

On the other hand, the CP mode $B_1^+$ efficiency remained unchanged, since $\lambda_{CP}$ was kept reasonably low for all four TxArray coils. For TxArray coils with 8, 16, 24, and 32 transmit channels, 1, 7, 11, and 20 of the excitation eigenmodes had a relatively higher modal reflected power (>0.93), respectively. Accordingly, these modes hardly contributed to the transmission process. For coils with 8 channels, seven excitation eigenmodes exhibited a total reflection of less than 50%; for coils with 16 channels, nine excitation eigenmodes exhibited a total reflection of less than 50%; for 24 channels, eight excitation eigenmodes exhibited a total reflection of less than 50%; and for 32 channels, eight excitation eigenmodes exhibited a total reflection of less than 50%. As such, the dimension of the excitation space remained relatively constant as the number of channels increased.

TABLE 3

Summary of the performance of the simulated TxArray coils designed based on the different minimization approaches

| | 2 × 4-channel λ-opt | | | 2 × 8-channel | | 2 × 12-channel λ-opt | 2 × 16-channel λ-opt |
|---|---|---|---|---|---|---|---|
| Minimization approach | case #1 | case #2 | case #3 | λ-opt case #1 | S-opt | case #1 | case #1 |
| $\lambda_1, \lambda_2, \ldots, \lambda_N$ | 0.02 | 0.01 | 0.04 | 0.10  0.42 | 0.06  0.65 | 0.05  0.61  0.99 | 0.07  0.50  0.98  1.00 |
| | 0.02 | 0.01 | 0.04 | 0.10  0.98 | 0.06  0.97 | 0.05  0.61  1.00 | 0.07  0.60  0.98  1.00 |
| | 0.09 | 0.05 | 0.08 | 0.10  0.98 | 0.15  0.98 | 0.34  0.63  1.00 | 0.40  0.60  0.98  1.00 |
| | 0.09 | 0.05 | 0.16 | 0.10  0.99 | 0.15  0.98 | 0.34  0.74  1.00 | 0.40  0.84  0.99  1.00 |
| | 0.14 | 0.28 | 0.17 | 0.24  0.99 | 0.50  0.98 | 0.49  0.75  1.00 | 0.43  0.93  0.99  1.00 |
| | 0.22 | 0.37 | 0.17 | 0.24  1.00 | 0.50  1.00 | 0.50  0.97  1.00 | 0.44  0.93  1.00  1.00 |
| | 0.30 | 0.45 | 0.18 | 0.40  1.00 | 0.63  1.00 | 0.50  0.98  1.00 | 0.48  0.98  1.00  1.00 |
| | 0.99 | 0.98 | 0.99 | 0.40  1.00 | 0.63  1.00 | 0.50  0.99  1.00 | 0.48  0.98  1.00  1.00 |
| $\lambda_{av} = \frac{1}{N}\sum_{n=1}^{N} \lambda_n$ | 0.23 | 0.27 | 0.23 | 0.56 | 0.64 | 0.71 | 0.78 |
| $\lambda_{CP}$ | 0.09 | 0.01 | 0.17 | 0.10 | 0.15 | 0.05 | 0.07 |
| $s_{nn}$ (dB) | −23.4 | −14.7 | −19.7 | −9.9 | −15.1 | −7.7 | −5.5 |
| $\max\{|s_{mn}|\}|_{m \neq n}$ (dB) | −12.3 | −10.8 | −12.2 | −5.9 | −4.7 | −6.8 | −8.4 |
| $B_1^+$ efficiency in the CP mode at Plane 2 ($\mu T/\sqrt{W}$) | 0.63 | 0.65 | 0.58 | 0.63 | 0.58 | 0.64 | 0.64 |

The results shown in Table 3 also demonstrate that the solution obtained for the 2×8-channel TxArray coil by the S-opt approach increases $\lambda_{CP}$ substantially (by 50%). The increase in $\lambda_{av}$ and $B_1^+$ efficiency is not significant (13% and 9%, respectively). Also, nine excitation eigenmodes with a total reflection of less than 50% are available with the solution acquired by the λ-opt (case #1) approach. In contrast, in the solution obtained by the S-opt approach, only six eigenmodes have this property, indicating that the λ-opt method significantly enlarges the excitation space.

For some applications that require more transmitted power or are constrained by some hardware limitations, a lower threshold value of modal reflected power can be considered for determining the excitation space. Considering an excitation space with a total reflected power of less than 40% shows that eight eigenmodes are available with the solution acquired by the λ-opt approach. In contrast, the S-opt approach offers only four excitation eigenmodes.

On the other hand, three different solutions of the λ-opt approach obtained for the 2×4-channel TxArray coil have shown that limiting $\lambda_{CP}$ to less than 0.01 (case #2) can increase 4, significantly (by 18%). Excluding $\lambda_{CP}$ from the minimization problem (case #3) did not cause a significant change in $\lambda_{av}$. The 2×4-channel TxArray coil exhibited only one excitation eigenmode with a reflection of more than 98% when any of the λ-opt methods were used. The above examples show that in many embodiments, the use of the different λ-opt cases does not alter the dimension of the excitation space. Furthermore, in the above examples, $\lambda_{CP}$ was changed significantly with the use of different cases. The results have also shown that the 2×4-channel TxArray coil is capable of achieving acceptable levels of impedance matching and decoupling.

Figure 7:
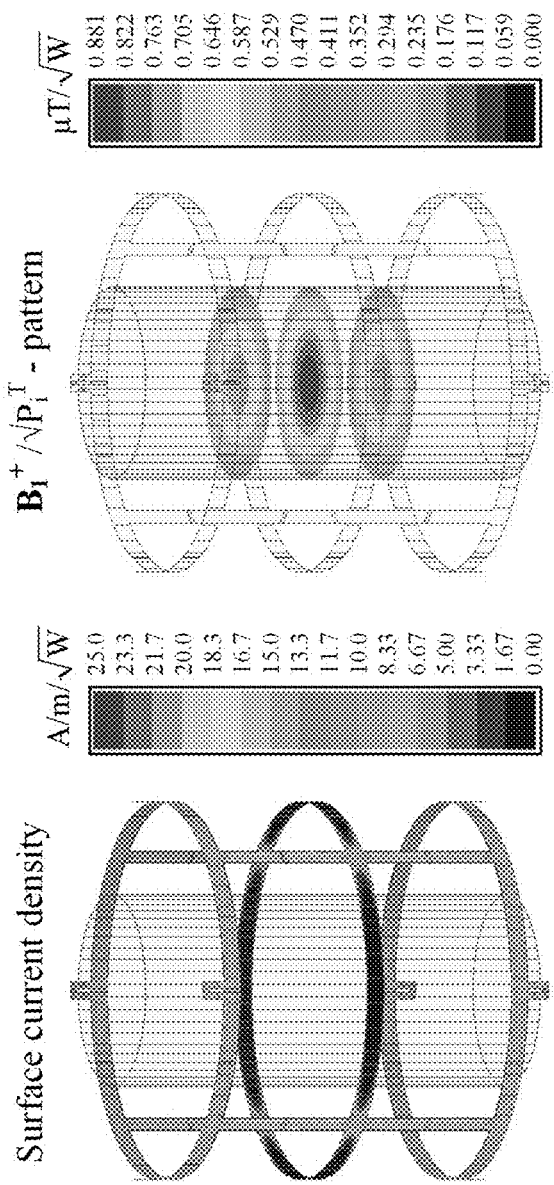
FIG. 7 shows simulation results for surface current density (left) and magnetic field ($B_1^+$) (right) pattern for a circularly-polarized (CP) mode at 3T.

FIG. 7 shows the computed surface current density on the 2×4-channel TxArray coil designed based on the λ-opt (case #2) approach and the $B_1^+$-patterns within the phantom at three different axial planes, i.e., Planes 1, 2, and 3 shown in FIG. 3, when the coil was driven in the CP excitation mode. The results were normalized by the square root of the total incident power. In the CP mode, the current on the middle-ring of the TxArray coil was almost zero. The results show that a stronger $B_1^+$-pattern was generated in Plane 2 compared with Planes 1 and 3 in the CP excitation mode, similar to the $B_1^+$-pattern generated by a conventional birdcage coil.

Figure 8:
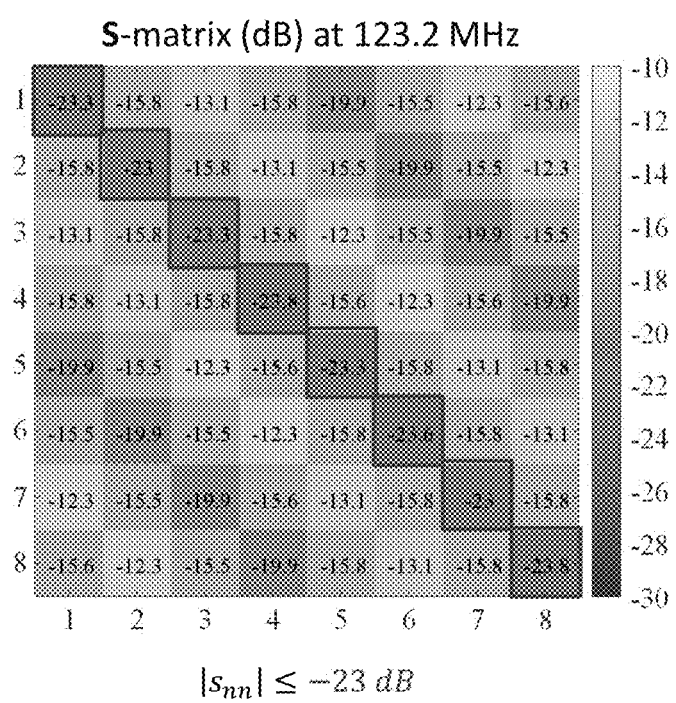
FIG. 8 shows a scattering (S) matrix calculated using a method according to the present teachings.
Figure 9:
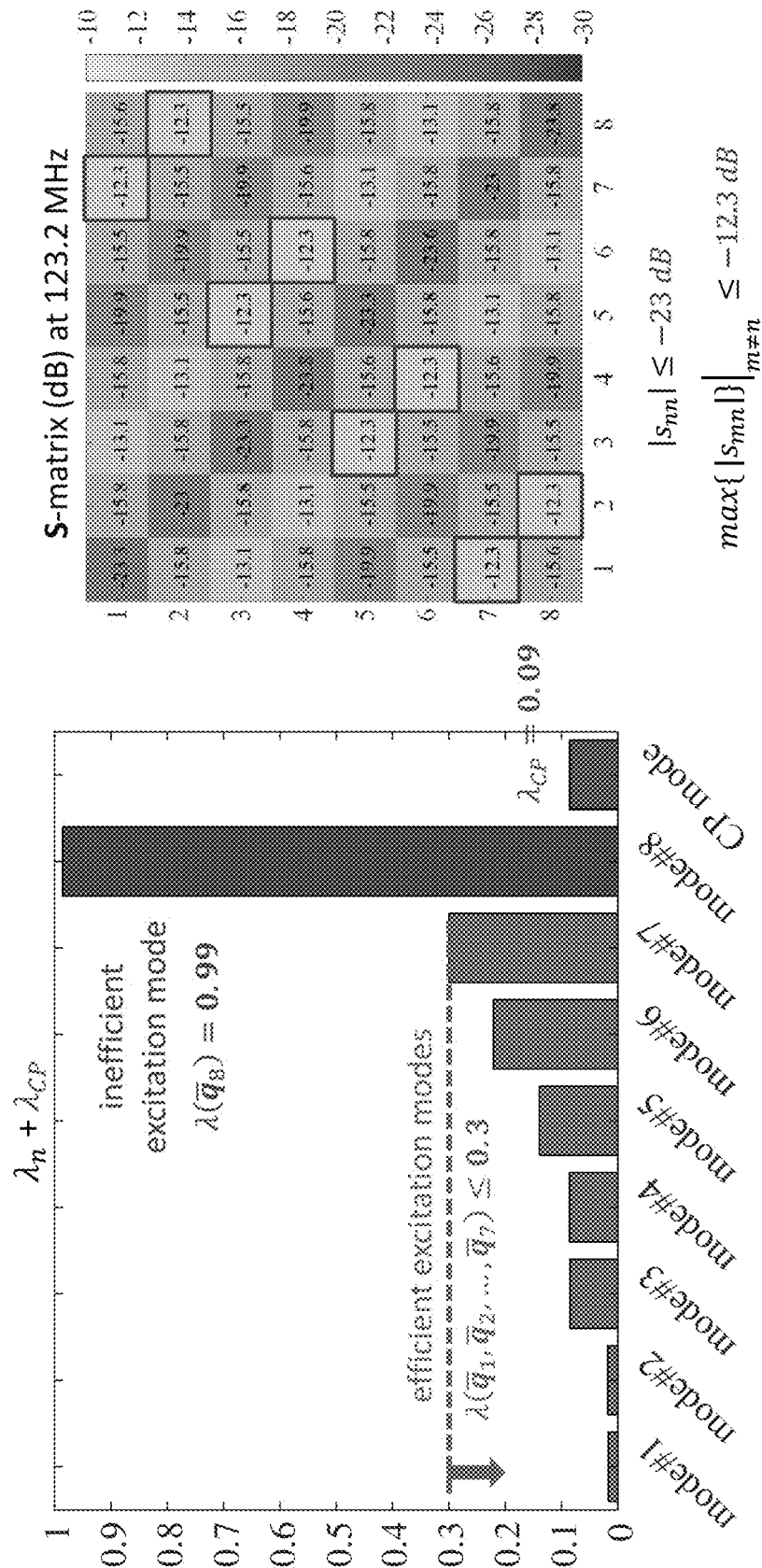
FIG. 9 shows simulated eigenvalues for each mode (left) and the S-matrix, highlighting the maximum coupling.

FIG. 8 shows a S-matrix calculated using the eigenmode analysis method according to an embodiment of the present teachings, and FIG. 9 shows simulated eigenvalues and the S-matrix, highlighting the maximum coupling of −12.3 dB. FIGS. 8 and 9 represent results for λ-opt (case #1). FIGS. 8 and 9 show that all transmit channels were generally well matched, and that the maximum coupling was −12.3 dB. The figures also indicate that one of the eigenmodes (mode #8) showed a higher reflection. If the coil were to be excited in mode #8, only about 1% of the incident power would be transmitted. These results show that at least in some cases, considering only the magnitudes of elements of the S-matrix may not be sufficient to determine the coil's transmission capabilities. Apart from mode #8, the coil exhibited 7 eigenmodes with less than 30% reflection, and also, in the CP mode, about 9% of the incident power was reflected. The simulation results demonstrate that in some embodiments, the present teachings can be utilized to minimize the CP mode even though the average of Xn values is increased.

Comparison of Simulation and Measurement Results

Figure 10:
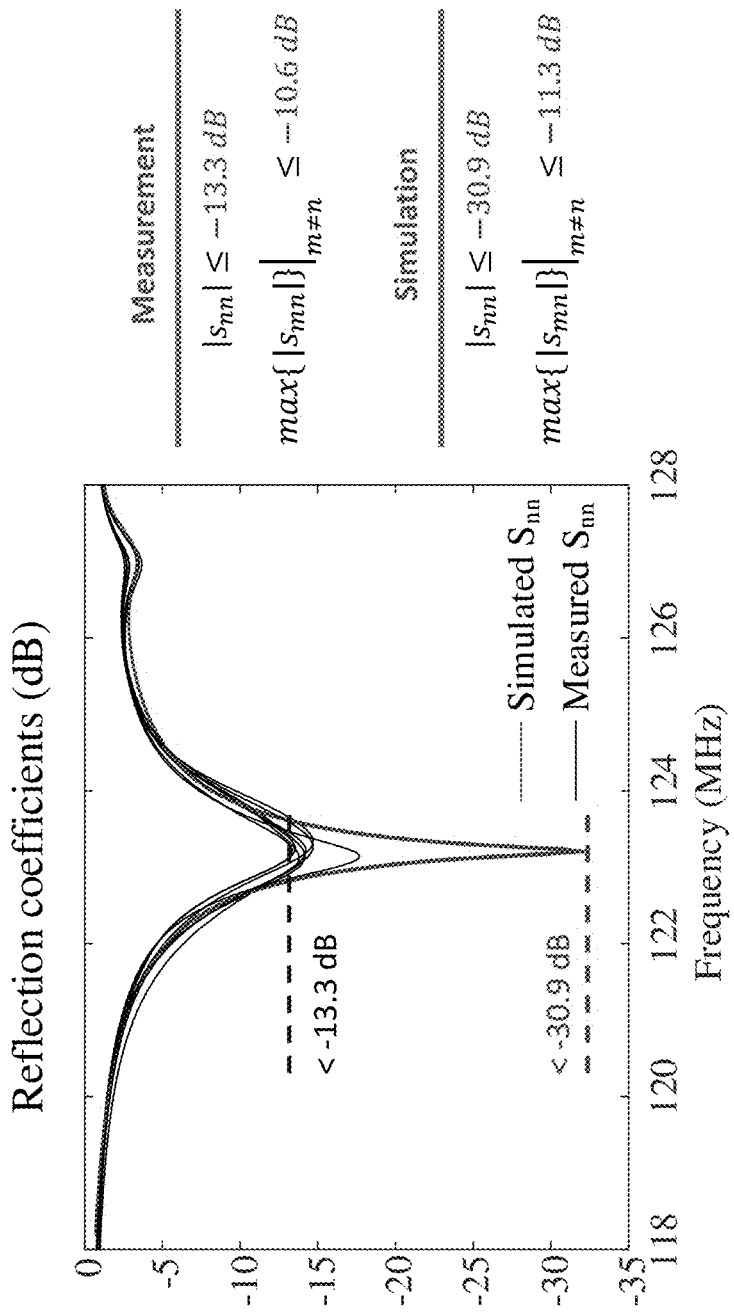
FIG. 10 compares measurement results and simulation results for reflection coefficients as a function of frequency for each mode.
Figure 11:
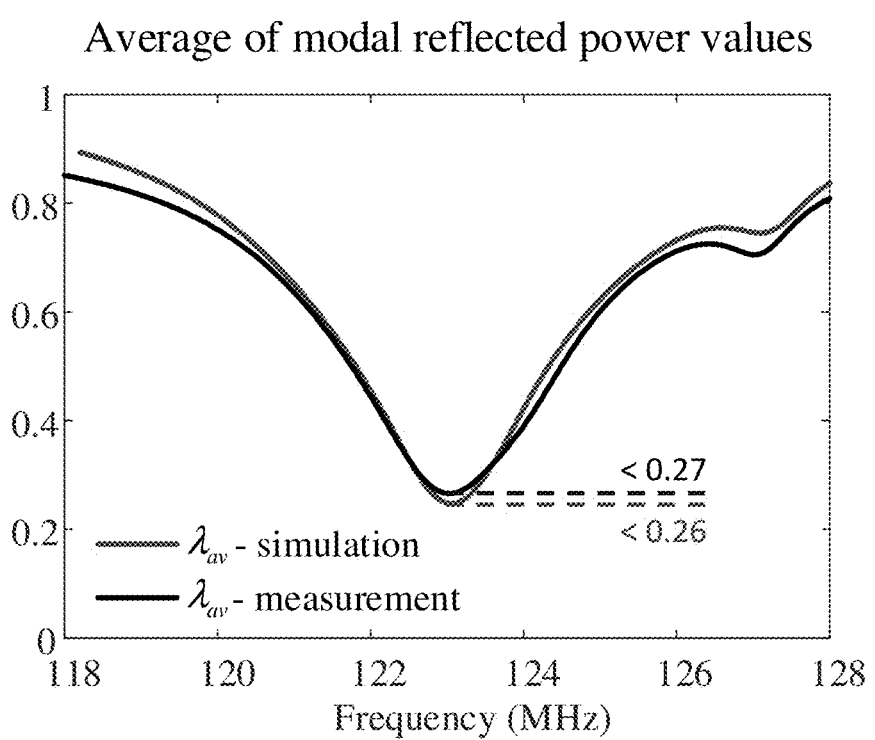
FIG. 11 compares measurement results and simulation results for average modal reflected power values as a function of frequency.
Figure 12:
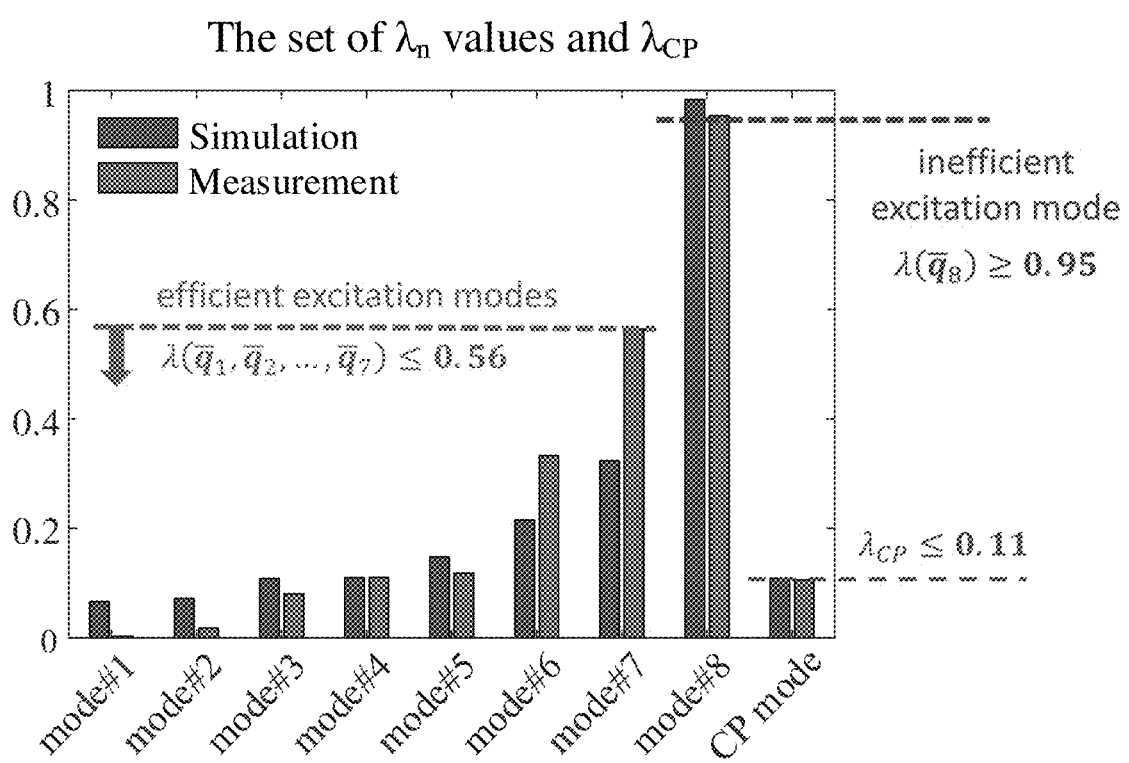
FIG. 12 compares measurement results and simulation results for reflection coefficients (eigenvalues) for each mode where the CP mode is not restricted.

FIGS. 10 and 11 show the simulated and measured reflection coefficients and $\lambda_{av}$ as a function of the RF frequency. Without being limited to any particular theory, the difference in the impedance matching and decoupling levels observed between the simulated coil and fabricated coil can be attributed to the imperfections in the construction of the coil. Note that the capacitors determined by the simulation were finely tuned to minimize the error between the simulated reflection coefficient and the measured reflection coefficient, $\lambda_{av}$ and $\lambda_{CP}$ at 123.2 MHz. FIG. 12 illustrates the simulated and measured modal reflected power values. For comparison, this figure also shows $\lambda_{CP}$. FIGS. 11 and 12 demonstate that the measured $\lambda_{CP}$ is in good agreement with the simulated $\lambda_{CP}$.

Figure 13:
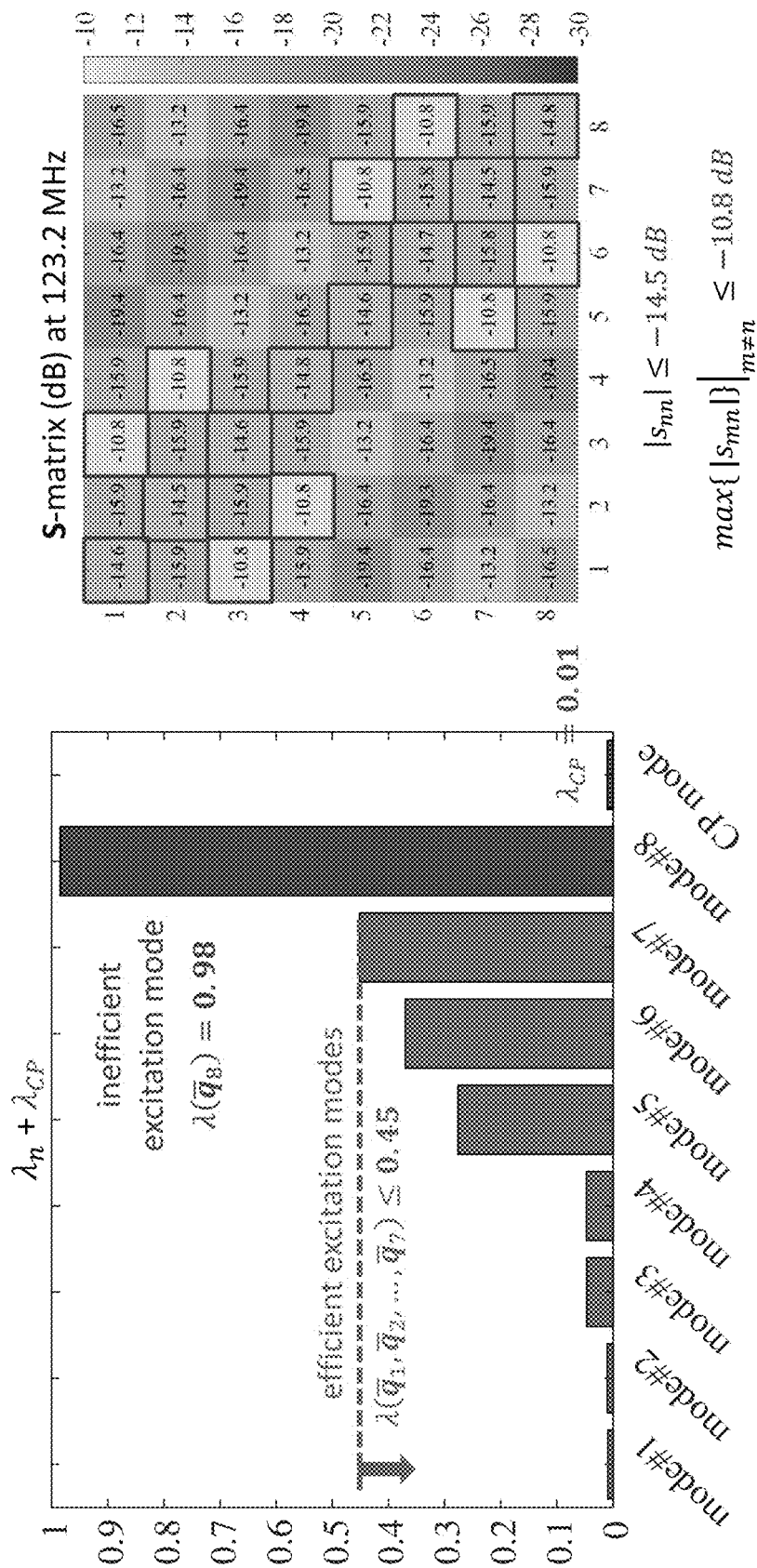
FIG. 13 shows simulated eigenvalues and the S-matrix where the reflection of the CP mode is restricted to less than 1%.

FIG. 13 shows simulated eigenvalues and the S-matrix where the reflection of the CP mode is restricted to less than 1% (case #2). The results show that all matching levels exhibit a reflection less than −14.5 dB, and the maximum coupling is increased to −10.8 dB. Similar to FIG. 9, seven eigenmodes exhibit less than 45% reflection although one eigenmode (mode #8) has a higher reflection. The average of Xn values (i.e., λav) has increased by 17%. $\Delta_{CP}$ was decreased to 1%.

Figure 14:
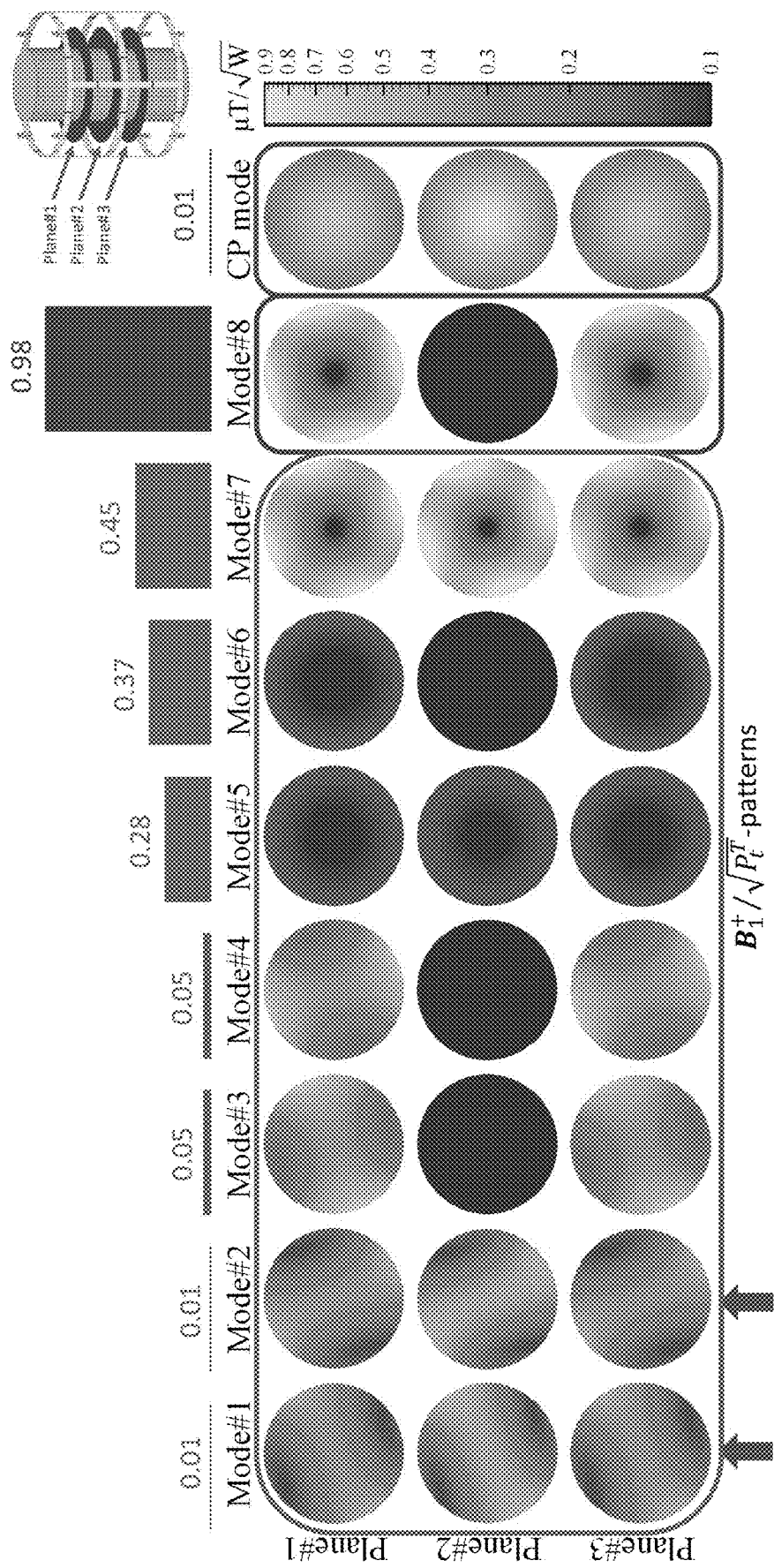
FIG. 14 shows simulated magnetic field ($B_1^+$) patterns for each mode where the reflection of the CP mode is restricted to less than 1%.

FIG. 14 shows normalized $B_1^+$ patterns of all 8 eigenmodes and the CP mode for the 8-channel coil at 3 axial planes. In this figure, the $B_1^+$ patterns are sorted from the eigenmodes with low reflection to high reflection. Eigenmodes 1 through 7 show a reflection less than 45%. The combinations thereof also have a reflection less than 45%. However, in this example, it would be preferable that the $B_1^+$ patterns of eigenmode number 8 be precluded in the RF shimming process since it has a 98% reflection.

FIG. 14 also indicates that the first and second eigenmodes produce linear fields that are perpendicular to each other. The fields generated by the CP mode mainly combine these two field patterns.

Figure 15A:
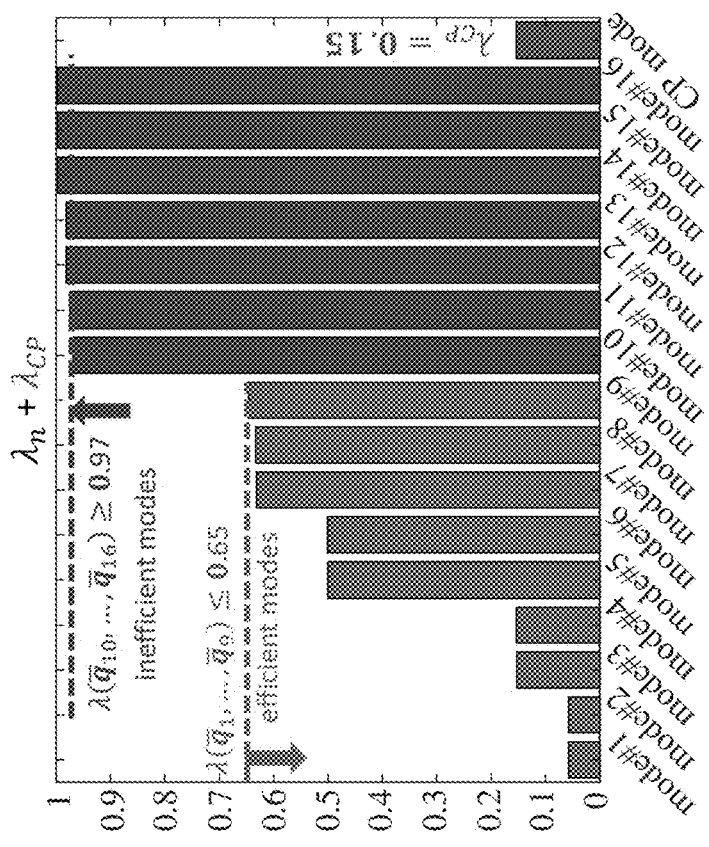
FIG. 15A shows simulation results with a λ-optimization method for a 2×8 transmit array coil.
Figure 15B:
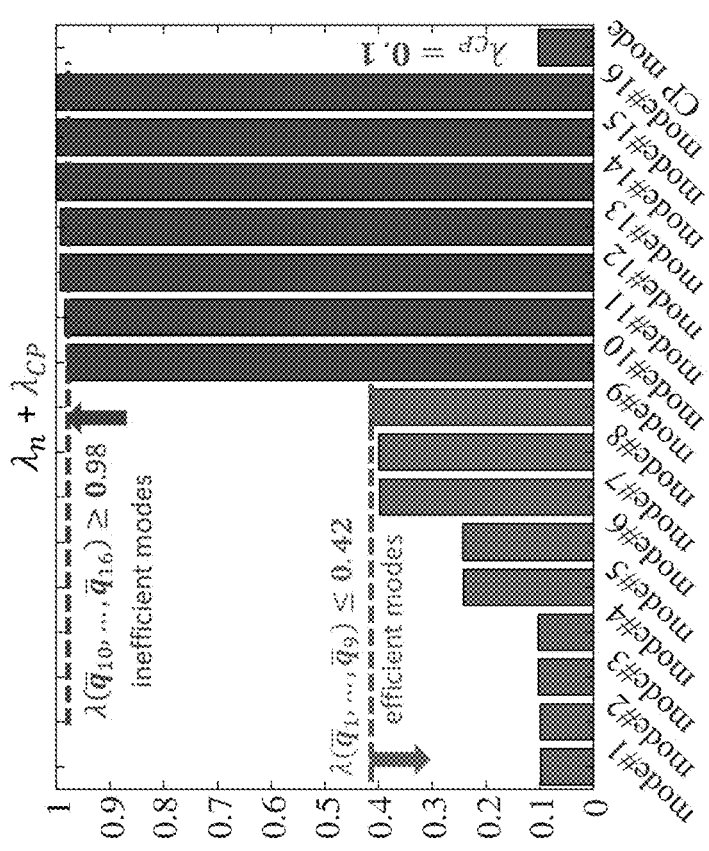
FIG. 15B shows simulation results with an S-optimization method for a 2×8 transmit array coil.

FIGS. 15A and 15B provide simulation results with a λ-optimization method and an S-optimization method, respectively, for a 2×8 transmit array coil. The results showed that in the λ-opt approach, all matching levels were less than −10 dB, and the maximum coupling level was less than −6 dB, while in the S-opt approach, the matching levels were less than −15 dB, and the maximum level of coupling was increased. Further, for both approaches, seven eigenmodes have high reflections, and the dimension of efficient excitation space for both approaches are equal. More particularly, in the λ-opt approach, the coil has 9 efficient eigenmodes with a reflection less than 42%, and in the S-opt approach, the reflection of the first 9 eigenmodes were less than 65%.

In the S-opt approach, the average of the efficient eigenmodes is about 58% higher than that in the λ-opt approach. The results also demonstrate that the solution obtained by the S-opt method increases $\lambda_{CP}$ by about 50%.

In summary of the eigenmode analysis of the S-matrix, the normalized reflected power was defined and used as the ratio of the total reflected power to the total incident power, to analyze the transmitting capabilities of TxArray coils. The excitation eigenmodes (the eigenvectors of $S^H S$) were presented as an orthogonal basis for the TxArray coil excitation. The eigenvalues of $S^H S$, $\Delta_n$, were assigned to the modal reflected power values. The normalized reflected power for an arbitrary excitation set, λ(a), was demonstrated to be quantified as the weighted sum of the $\lambda_n$ values, which indicates that in at least some embodiments, the $\lambda_n$ values can characterize the transmission capabilities of the TxArray coil.

As discussed above, ideally, zero total reflected power for all possible excitation sets is needed to design an ideal TxArray coil, which corresponds to a zero set of $\lambda_n$ values. In other words, the S-matrix needs to be a null matrix to achieve an ideal TxArray coil. This is also the ideal design target to achieve perfect matching and decoupling levels. Due to the practical imperfections, however, the S-matrix cannot be zero. Nevertheless, methods and systems according to the present teachings can minimize the S-matrix elements. As discussed above, in embodiments, the eigenmode analysis according to the present teachings evaluates the S-matrix as a whole, instead of considering individual elements of the S-matrix. Hence, the minimization of the $\lambda_n$ values offers a convenient approach for the design of TxArray coils.

The eigenmodes with high modal reflected power values (e.g., reflected power values greater than about 90%) hardly contribute to the transmission process and can, to a certain degree, be considered inefficient and unavailable. The eigenmode analysis according to the present teachings thus provides insight in determining the optimum number of transmit elements. Hence, the number of efficient eigenmodes can be considered as a critical metric to compare the performance of various TxArray coils.

Therefore, in some aspects, the present teachings provide methods for designing and fabricating TxArray coils by increasing the number of efficient eigenmodes. The set of eigenmodes that has low reflection is considered as the excitation space of the TxArray coil. In the design process, the coverage of the excitation space can be modified since it is preferable that the excitation space be expanded. In the examples presented above, the CP excitation was limited within this space. In use, one of ordinary skill in the art may add additional modes to the optimization process that are significant for the specific design.

As described above, the dual-row TxArray coil can behave like a single-row degenerate birdcage TxArray coil, providing the CP excitation field patterns under certain circumstances. Consequently, the dual-row TxArray coil can take advantage of the parallel transmit technology without losing the advantages of a conventional birdcage coil to obtain homogenous excitation patterns in a large volume.

In embodiments, for the analysis and design of the TxArray coils, modal reflected power can be utilized. The capacitor values can be found by using the λ-opt approach described herein. In this approach, the $\lambda_n$ values can be minimized to increase the dimension of the excitation space (a subspace comprising the excitation eigenmodes with low total reflected power values). Additionally, the total reflected power for some critical modes of operation, such as the CP excitation mode, can be incorporated as a constraint in the optimization process. To examine the impact of the added constraint and weighting coefficients on the coil performance, three different minimization cases of the λ-opt approach were employed above. To validate the effectiveness of the λ-opt approach, the optimal design performance of a dual-row TxArray coil achieved by the λ-opt method was compared with the optimal design obtained by the conventional minimization approach (S-opt). Consequently, the methods according to the present teachings were demonstrated to be capable of increasing the excitation space, and thus allowing achieving critical modes of operation without significant reflection.

In a related aspect, the present teachings provide a method of refining or updating fabricated TxArray coils using lumped-elements and distributed models. According to an aspect of the present teachings, subsequent to assembling the coils with the simulated optimal lumped-elements, the scattering parameters of the fabricated coils can be measured, and all unknown elements of the coil's equivalent circuit model can be predicted based on the measured parameters. For example, in some such embodiments, the inductance and resistance values of the coils of the fabricated coil array can be measured and used to update and refine the design parameters of the coil array. Adjusting the free design parameters that are integrated with circuit models can result in the proper design of manufactured TxArray coils. This process provides a means to reduce any difference between the experimental and simulation results caused by the imperfection and tolerances in coil's manufacturing. In other words, the equivalent circuit models can be used not only to design the optimal lumped-elements of the array coils, as described above, but also to characterize manufactured array coils. Once such differences are identified, one or more characteristic of one or more of the coils can be adjusted to reduce the differences.

By way of example, an evaluation of the performance of simulated and manufactured 8-channel TxArray coil with capacitively decoupled channels for use in a 3T MRI system will be described. Fine-tuning a fabricated coil array to match its characteristics to those provided via simulation can be laborious as adjusting one coil's channel will affect the performance of other channels. The equivalent circuit model of the fabricated TxArray coil can be utilized by considering all magnetic and electrical couplings to determine all inductance and resistance values, which are required for organizing the circuit model. The design approach according to the present teachings, based on the eigenmode analysis of the scattering matrix (S-matrix) can be used to obtain the optimal capacitor values. The capacitor values are optimized to expand the excitation space of the TxArray coil with a low level of total reflected power.

Simulated TxArray Coil

Figure 16:
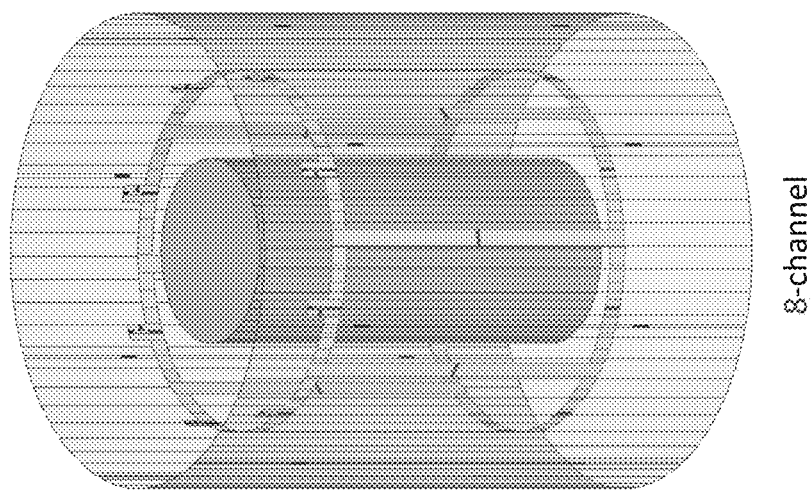
FIG. 16 shows a circuit model and a schematic of an 8 (1×8) channel transmit array coil.
Figure 16:
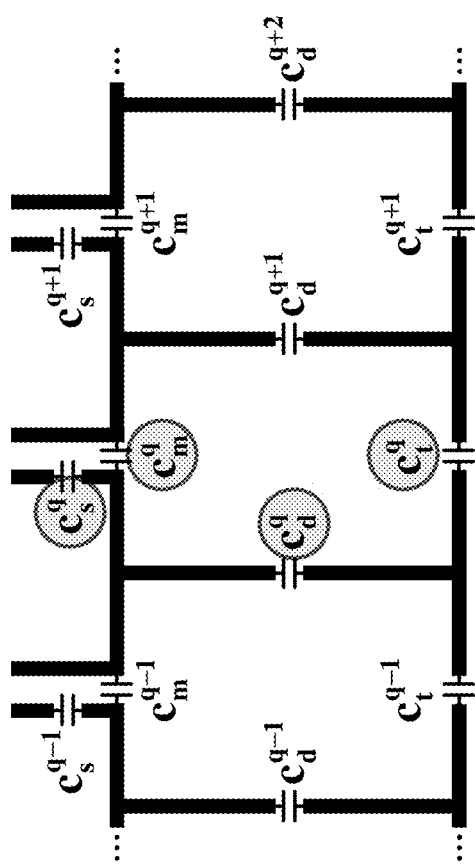
Figure 17:
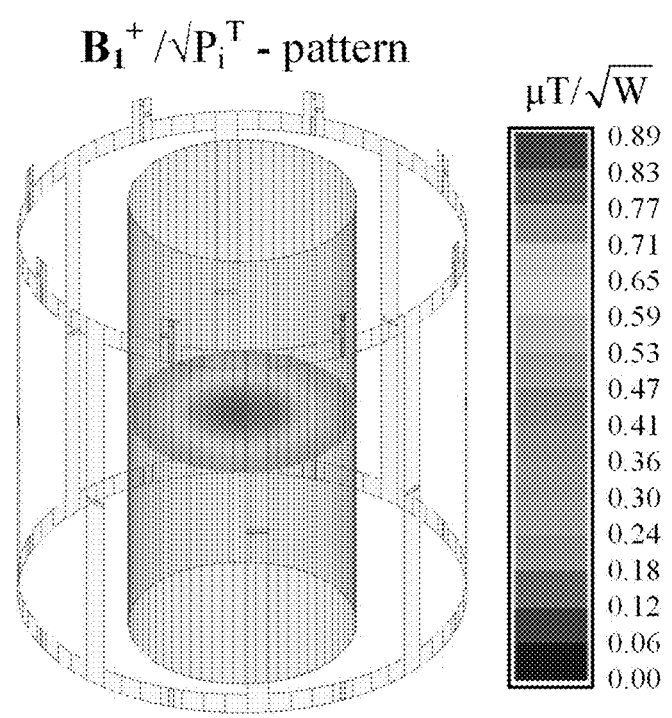
FIG. 17 shows simulation results for magnetic field ($B_1^+$) pattern for a circularly-polarized (CP) mode at 3T for a 1×8 channel transmit array coil.

FIG. 16 depicts a schematic and a circuit model of an 8-channel degenerate birdcage TxArray coil. The coil has a cylindrical shape with a diameter of 315 mm and a length of 300 mm and comprises eight transmit channels of the same dimensions. The width of all end-rings and rungs is 15 mm. The coil is shielded with a cylinder having a diameter of 412 mm and a length of 500 mm. The shield is slit into eight segments that are evenly distributed along the axial direction to decrease eddy current induced by gradient fields, where the adjacent slits are connected via two 3 nF capacitors at positions facing the coil's end-rings. A cylindrical phantom placed in the center of the coil with a conductivity of 0.62 S/m, a relative permittivity of 80, a diameter of 153 mm, and a length of 350 mm is then used to load the coil. As shown in FIG. 17, when the CP excitation is applied to this coil, it produces a $B_1^+$ field similar to a conventional birdcage coil.

The decoupling strategy is based on the capacitive decoupling by adjusting the capacitors placed between the nearest neighbors. More particularly, $c_d^q$ denotes decoupling capacitor, which is used to decouple the neighboring loops. Additionally, $c_t^q$ denotes tuning capacitor, $c_m^q$ denotes matching capacitor, and $c_s^q$ denotes the series matching capacitor, which is used to improve the matching level with an additional degree of freedom.

To implement the numerical simulations, ANSYS Electronics Desktop (ANSYS Inc., Canonsburg, Pa., USA) was used. A finite conductivity boundary with the properties of copper was assigned for all coil and shield conductors. The co-simulation strategy with combining finite element method and circuit simulation analysis was used to adjust the capacitor values. The geometry of the simulated TxArray coil is circularly symmetric, and therefore, to reduce the number of unknown parameters, it can be assumed that the values of the capacitors used in the same sections of different channels are equal. Consequently, as shown in FIG. 16, four distinct capacitors, i.e., $\bar{c}=c_d\ c_t\ c_m\ C_s]$, together with their equivalent series resistances, are considered as free design parameters to control the performance of the simulated TxArray coil.

Manufactured TxArray Coil and Characterization Thereof.

Figure 18:
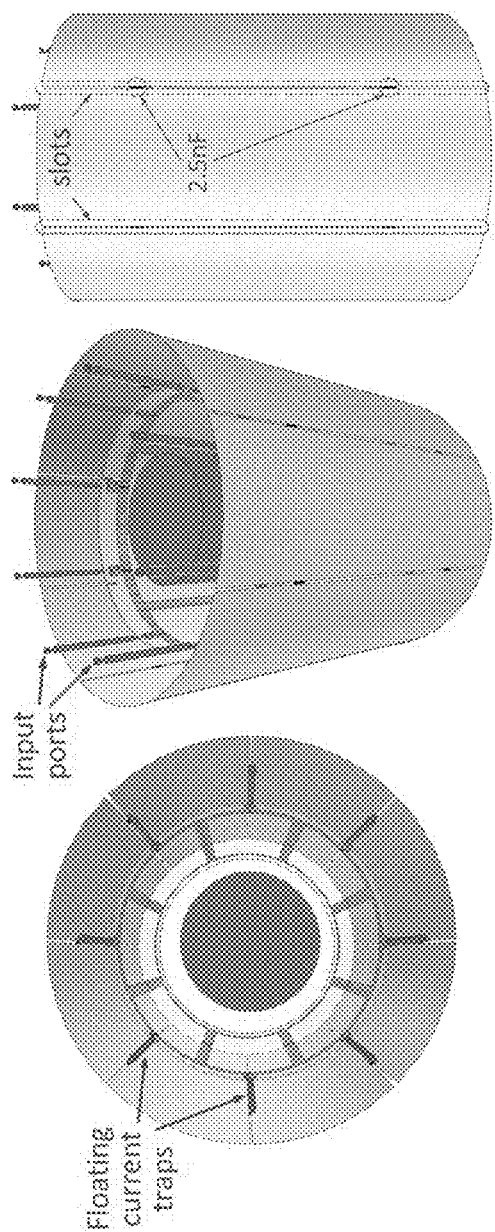
FIG. 18 shows an example of a fabricated 8 channel degenerate birdcage TxArray coil according to an embodiment of the present teachings.

FIG. 18 depicts an 8-channel degenerate birdcage TxArray coil constructed with the same dimensions of the simulated coil shown in FIG. 16. Two cylindrical plexiglasses support the structure of the TxArray coil. The shield is divided into eight uniformly spaced segments distributed along the axial direction. All segments of the coil and shield were copper strips with a thickness of 35 µm. Eight floating current traps constructed and added to the coil to prevent common-mode currents at 123.2 MHz.

The optimal capacitor values achieved from the simulation, such as described above, were used in the coil's prototype. The adjacent segments of the shield are connected with two 3 nF capacitors at locations facing the coil's end-rings. All used capacitors were non-magnetic surface-mounted high-Q capacitors. An SNR phantom (USA Instruments Inc., containing 3.7 g/L $NiCl_2.6H_2O$ and 2.4 g/L NaCl) with a cylindrical shape and a diameter of 153 mm was used to load the TxArray coil. Using magnetic resonance electrical properties tomography (MREPT) technique, the conductivity of the phantom was measured as 0.62 S/m. The relative permittivity of the phantom was assumed to be the same as the relative permittivity of water.

Figure 19:
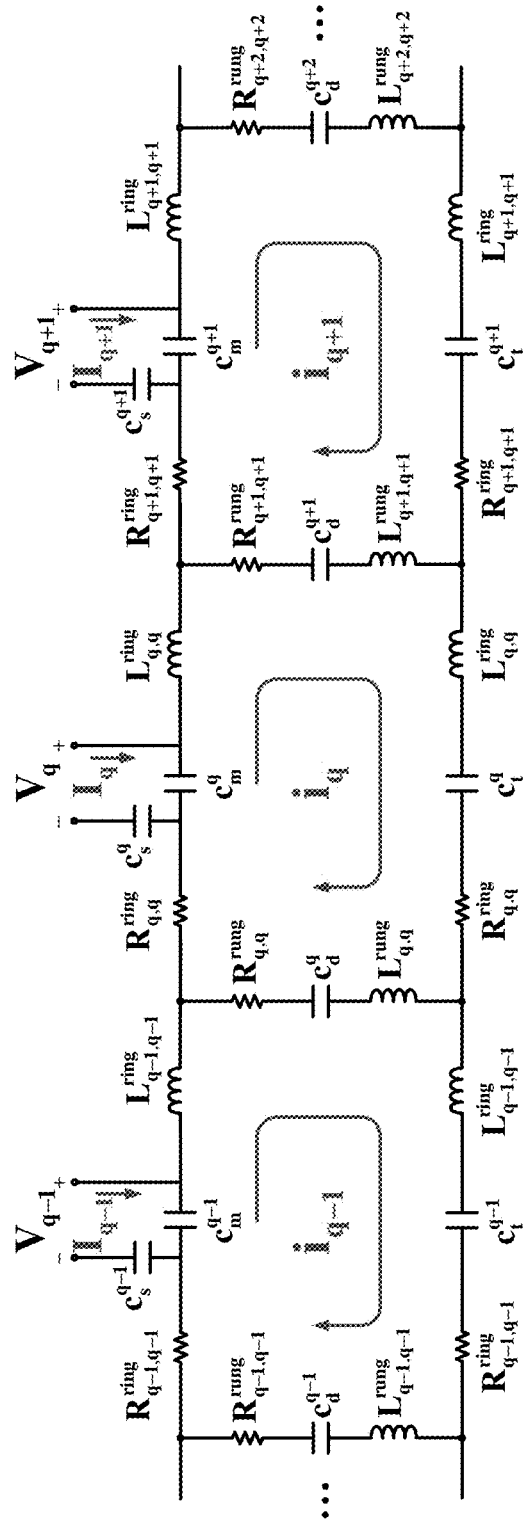
FIG. 19 shows an equivalent lumped element circuit model for the fabricated 8 channel degenerate birdcage TxArray coil according to the present teachings.

Since the TxArray coil was not machine-manufactured, some discrepancies are to be expected between the simulated and measured S-matrices. To better characterize the fabricated TxArray coil and to reduce the discrepancies between the simulation and measurement results, the equivalent circuit model of the manufactured TxArray coil and the capacitors achieved from the simulation can be integrated. This method of refining the equivalent circuit model according to the present teachings enables better characterization of the manufactured TxArray coil. FIG. 19 illustrates the equivalent circuit model of the manufactured TxArray coil, which provides an efficient strategy to determine the suitable capacitors for the fabricated TxArray coil.

The effects of all self/mutual-inductances and self/mutual-resistances emanating from the coil, the shield, and the load are taken into consideration. The current on an element of the coil can induce the eddy currents on the subject. These eddy currents can induce an electromotive force on other elements of the coil. This effect can be modeled as a mutual-resistance. In FIG. 19, $L_{q,q}^{ring}$ ($R_{q,q}^{ring}$) denotes the self-inductance (-resistance) of the qth arc at top/bottom end-ring; and $L_{q,q}^{rung}$ ($R_{q,q}^{rung}$) denotes the self-inductance (-resistance) of the qth rung. Although it is not shown in FIG. 19, the mutual-inductance (-resistance) between the qth and pth arcs in the same end-ring denotes as $L_{q,p}^{ring}$ ($R_{q,p}^{ring}$), the mutual-inductance (-resistance) between the qth and pth arcs in the different end-rings denotes as $\tilde{L}_{q,p}^{ring}$ ($\tilde{R}_{q,p}^{ring}$), and the mutual-inductance (-resistance) between the qth and pth rungs denotes as $L_{q,p}^{rung}$ ($R_{q,p}^{rung}$).

According to the image theory, the electromagnetic field produced by the currents induced on the surface of the RF shield is equal to the electromagnetic field produced by the image of the original currents running on the TxArray coil. Therefore, the RF shield effect can be modeled with an imaginary TxArray coil with the same physical shape and radius of $r_i=r_s^2/r_c$, where $r_c$ and $r_s$ are the coil and shield radii, respectively. The imaginary currents are in the opposite direction of the original currents to satisfy the boundary condition on the surface of the RF shield. Consequently, the effects of the shield are taken into consideration by adding the mutual-inductance (-resistance) between the qth arc and the image of pth arc in the same end-ring which denotes as $L_{q,p}^{ring'}$ ($R_{q,p}^{ring'}$), the mutual-inductance (-resistance) between the qth arc and the image of pth arc in the different end-rings which denotes as $\tilde{L}_{q,p}^{ring'}$ ($\tilde{R}_{q,p}^{ring'}$), and the mutual-inductance (-resistance) between the qth rung and the image of pth rung which denotes as $L_{q,p}^{rung'}$ ($R_{q,p}^{rung'}$).

By analyzing the circuit model with Kirchhoff mesh current method, the following matrix equation can be derived:

$$\left(j\omega L(\omega) + \frac{1}{j\omega}C + R(\omega)\right)i(\omega) = \frac{1}{j\omega}C_m I(\omega) \quad (10)$$

where $\omega$ is the angular frequency; $j=\sqrt{-1}$; $i(\omega)=[i_q(\omega)]_{8\times 1}$ denotes the vector of loop currents; and $I(\omega)=[I_q(\omega)]_{8\times 1}$ denotes the vector of current sources. Further, $C=[C_{q,p}]_{8\times 8}$ and $C_m=[C_{q,p}^m]_{8\times 8}$ represent the capacitance matrices where $C_{q,p}$ and $C_{q,p}^m$ are defined as:

$$C_{q,p} = \begin{cases} \frac{1}{c_d^{q-1}} + \frac{1}{c_d^q} + \frac{1}{c_t^q} + \frac{1}{c_m^q} & \text{if } q = p \\ -\frac{1}{c_d^{\min(q,p)}} & \text{if } q - p \equiv \pm 1 (\text{mode } 8) \\ 0 & i = \text{otherwise} \end{cases} \quad (11)$$

$$C_{q,p}^m = \begin{cases} \frac{1}{c_m^q} & \text{if } q = p \\ 0 & \text{otherwise} \end{cases} \quad (12)$$

$L=[L_{q,p}]_{8\times 8}$ and $R=[R_{q,p}]_{8\times 8}$ also represent the inductance and resistance matrices, respectively, in which $L_{q,p}$ and $R_{q,p}$ are given by:

$$L_{q,p} = L_{q,p}^{rung} - L_{q,p}^{rung'} - L_{q+1,p}^{rung} + L_{q+1,p}^{rung'} - L_{q,p+1}^{rung} + L_{q,p+1}^{rung'} + L_{q+1,p+1}^{rung} - L_{q+1,p+1}^{rung'} + 2(L_{q,p}^{ring} - L_{q,p}^{ring'} - \tilde{L}_{q,p}^{ring} + \tilde{L}_{q,p}^{ring'}) \quad (13)$$

$$R_{q,p} = R_{q,p}^{rung} - R_{q,p}^{rung'} - R_{q+1,p}^{rung} + R_{q+1,p}^{rung'} - R_{q,p+1}^{rung} + R_{q,p+1}^{rung'} + R_{q+1,p+1}^{rung} - R_{q+1,p+1}^{rung'} + 2(R_{q,p}^{ring} - R_{q,p}^{ring'} - \tilde{R}_{q,p}^{ring} + \tilde{R}_{q,p}^{ring'}) \quad (14)$$

In accordance with Kirchhoff mesh current method, the qth voltage source can be found as:

$$V_q(\omega) = \frac{1}{j\omega}\left(\frac{1}{c_m^q} + \frac{2}{c_s^q}\right)I_q(\omega) - \frac{1}{j\omega c_m^q}i_q(\omega) \quad (15)$$

This equation can be written in the matrix form as:

$$V(\omega) = \frac{1}{j\omega}(C_m + 2C_s)I(\omega) - \frac{1}{j\omega}C_m i(\omega) \quad (16)$$

where $V(\omega)=[V_q(\omega)]_{8\times 1}$ denotes the vector of voltage sources and $C_S=[C_{q,p}^s]_{8\times 8}$, where its elements are given by:

$$C_{q,p}^s = \begin{cases} \frac{1}{c_s^q} & \text{if } q = p \\ 0 & \text{otherwise} \end{cases} \quad (17)$$

Substituting the vector of loop input currents, obtained from Equation (10), into Equation (16) gives:

$$V(\omega) = \left(\frac{1}{j\omega}(C_m + 2C_s) + \frac{1}{\omega^2}C_m\left(j\omega L(\omega) + \frac{1}{j\omega}C + R(\omega)\right)^{-1}C_m\right)I(\omega) \quad (18)$$

Therefore, the impedance matrix (Z-matrix) of the manufactured TxArray coil's model can be expressed as follows:

$$Z(\omega) = \frac{1}{j\omega}(C_m + 2C_s) + \frac{1}{\omega^2}C_m\left(j\omega L(\omega) + \frac{1}{j\omega}C + R(\omega)\right)^{-1}C_m \quad (19)$$

The S-matrix in terms of the impedance matrix can be written as:

$$S(\omega) = (Z(\omega) + Z_0 U)^{-1}(Z(\omega) - Z_0 U) \quad (20)$$

where $Z_0$ is characteristic impedance; and U returns an 8×8 identity matrix.

In the construction of the manufactured TxArray coil, the optimized capacitor values achieved from the simulation environment initially can be used. Subsequently, by measuring the Z-matrix of the manufactured TxArray over a wide range of frequencies for these initial capacitor values, the inductance and resistance matrices can be calculated as:

$$R(\omega) = \frac{1}{\omega^2}\text{Re}\left\{C_m\left(Z(\omega) - \frac{1}{j\omega}(C_m + 2C_s)\right)^{-1}C_m\right\} \quad (21)$$

$$L(\omega) = \frac{1}{\omega^3}\text{Im}\left\{C_m\left(Z(\omega) - \frac{1}{j\omega}(C_m + 2C_s)\right)^{-1}C_m\right\} + \frac{1}{\omega^2}C \quad (22)$$

Once the inductance and resistance matrices are determined, a new set of capacitor values can be obtained by minimizing the cost function implemented in Equation (7) for the manufactured TxArray coil. The new Z-matrix (or S-matrix), which fulfills the design criteria, can be obtained by updating capacitor values used in the manufactured TxArray coil.

Iteration for Parameters

Initially, the structure of the manufactured TxArray coil was assumed to be identical to that of the simulated TxArray coil, which resulted in the use of nearly identical capacitors in both structures. The optimized capacitor values obtained based on the λ-opt (case #1) approach for the simulated coil were 12.8 pF, 9.5 pF, 34.7 pF, and 10.5 pF for $c_d$, $c_t$, $c_m$, and $c_s$, respectively. In the first iteration, the same capacitor values were used for the manufactured TxArray coil, with a tolerance of less than 2%.

Figure 20:
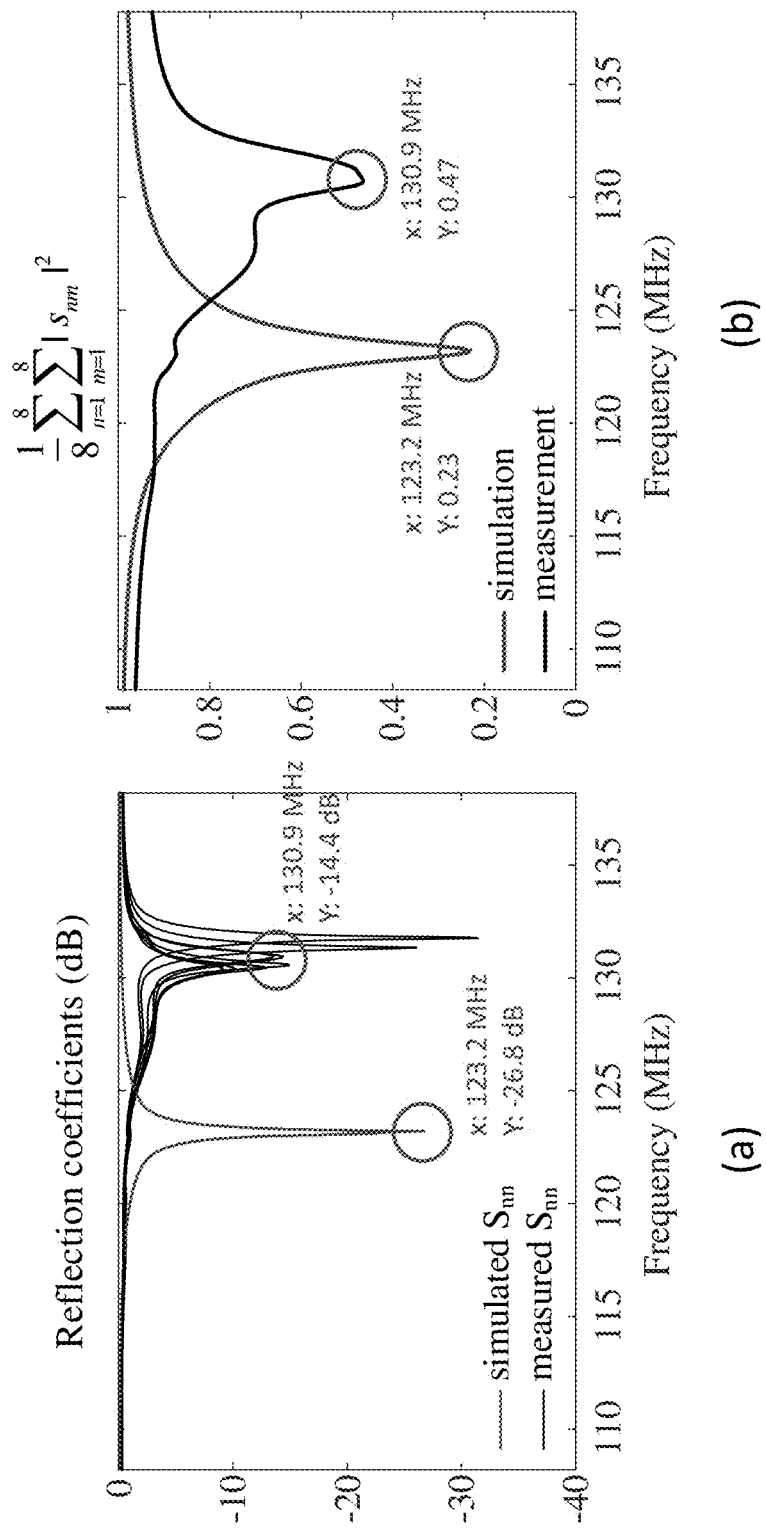
FIG. 20 compares simulation results and measurement results for (a) reflection coefficients and (b) average of modal reflected power values, $\lambda_{av}$, of the fabricated 8-channel TxArray coil as a function of frequency.

FIG. 20 illustrates (a) the reflection coefficients and (b) the average of modal reflected power values, $\lambda_{av}$, for both simulated and manufactured 8-channel TxArray coils as a function of frequency. FIG. 20 shows that all transmit channels of the simulated TxArray coil resonate at 123.2 MHz with a reflection coefficient of less than −26 dB, which shows that they are very well matched and tuned. Unlike the simulation, however, the transmit channels of the manufactured TxArray coil resonate at different frequencies (ranging from 130.4 MHz to 131.8 MHz) with different matching levels (ranging from −9 dB to −31 dB). On average, the resonances of the manufactured TxArray coil are 7.7 MHz higher than the desired resonance frequency. Panel (b) of FIG. 20 shows that the lowest value of $\lambda_{av}$ for the simulated TxArray coil is 0.23, which is attained at 123.2 MHz. On the other hand, for the manufactured TxArray coil, the lowest value of $\lambda_{av}$ is 0.47, at 130.9 MHz. Since $\lambda_{av}$ is also equal to $\frac{1}{8}\Sigma_{n=1}^{8}\Sigma_{m=1}^{8}|s_{mn}|^2$, it can be inferred that in addition to the difference in the resonance frequencies and reflection coefficients of the simulated and manufactured TxArray coils, other scattering parameters are also different.

Figure 21:
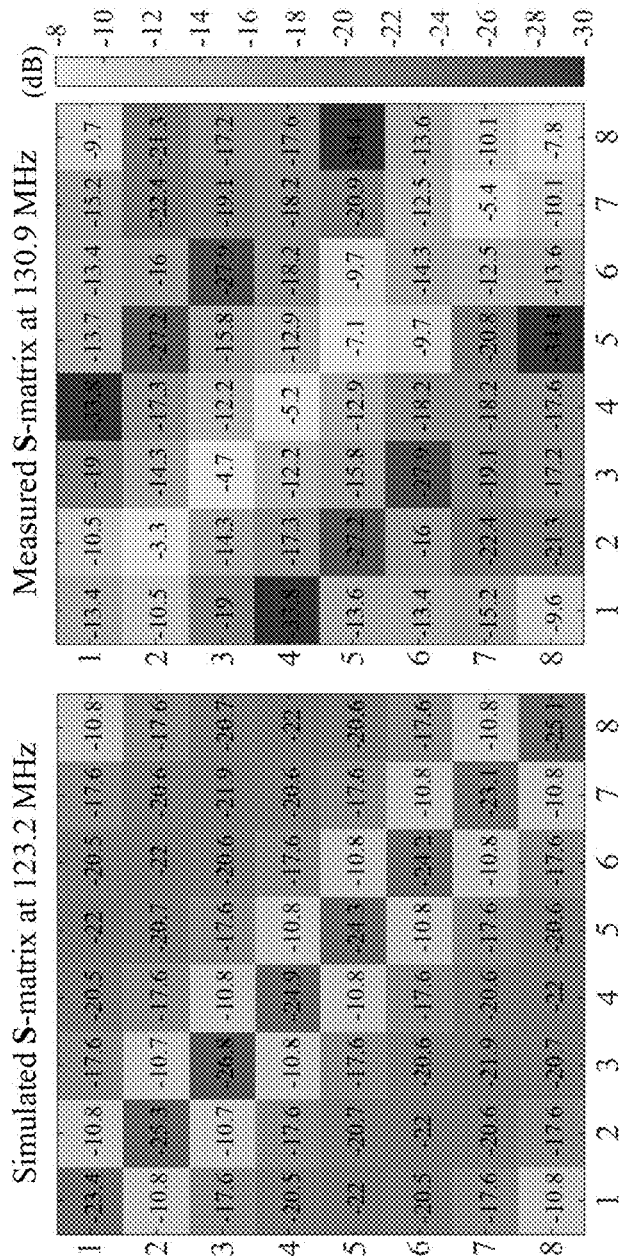
FIG. 21 compares (a) simulated S-matrix and (b) measured S-matrix for the fabricated 8-channel TxArray coil.

FIG. 21 presents (a) the simulated S-matrix at 123.2 MHz and (b) the measured S-matrix at 130.9 MHz of the 8-channel TxArray coil, respectively. The maximum difference in the matching and coupling levels are −2.8 dB and −4.8 dB, respectively.

As expected, the measurement results are different than the simulation results when the same capacitances were used in both the manufactured and simulated TxArray coils. This difference can be explained by the imperfections of the coil's construction, which indicates that the manufactured and simulated structures are not identical. By applying the correction method according to the present teachings to the manufactured TxArray coil and measuring its inductance and resistance matrices, new quantities of the capacitor values can be determined. The optimized capacitor values obtained based on the λ-opt approach for the manufactured coil were 14.5±0.1 pF, 10.6±0.7 pF, 40.4±0.2 pF, and 12.9±0.1 pF for $c_d$, $c_t$, $c_m$, and $c_s$, respectively.

Figure 22:
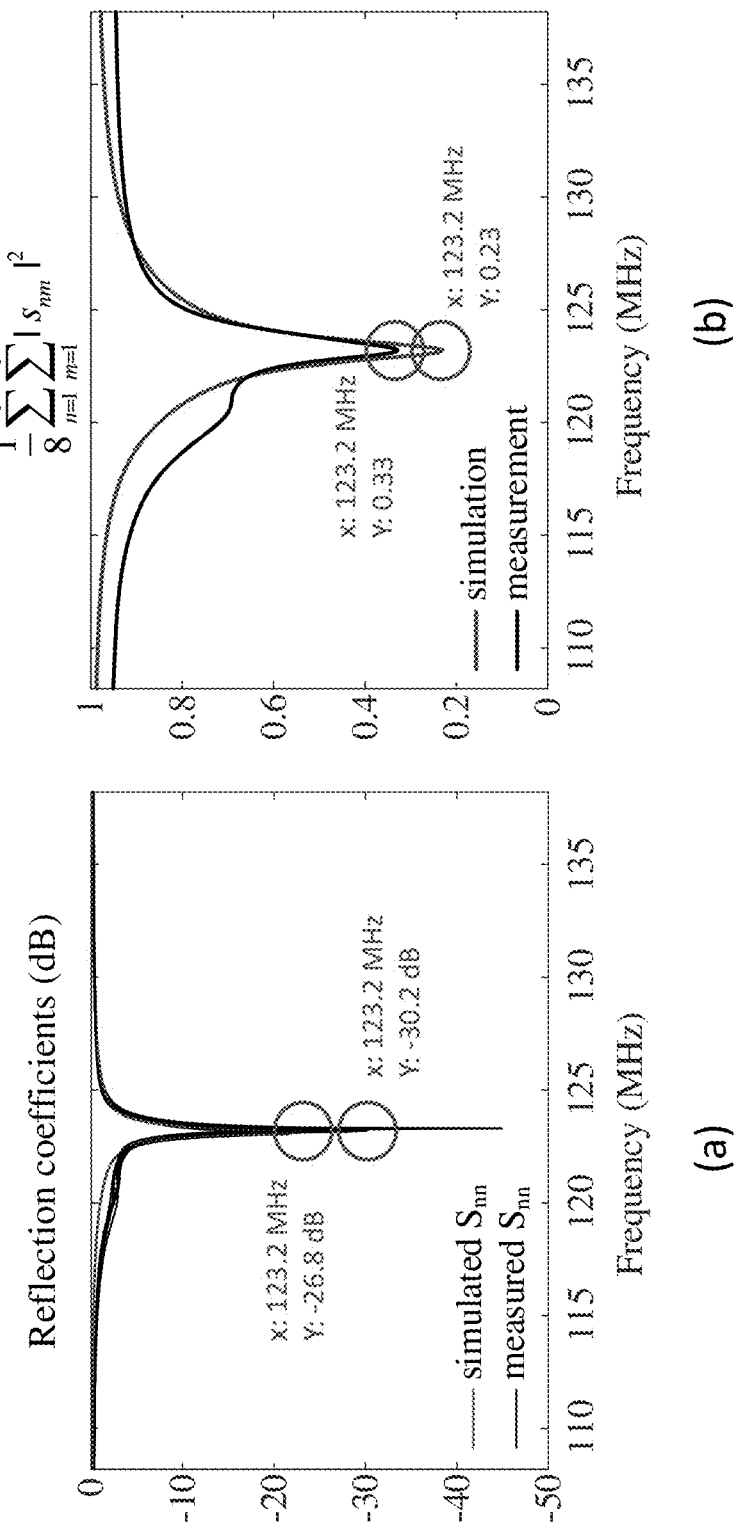
FIG. 22 compares simulation results and measurement results for (a) reflection coefficients and (b) average of modal reflected power values, $\lambda_{av}$, of the updated 8-channel TxArray coil as a function of frequency.

FIG. 22 illustrates (a) the reflection coefficients and (b) $\lambda_{av}$ for the manufactured 8-channel TxArray coil with the updated set of capacitors as a function of frequency. For comparison, this figure also shows the reflection coefficients and $\lambda_{av}$ for the simulated 8-channel TxArray coil. As shown in panel (a) of FIG. 22, all transmit channels of the manufactured TxArray coil resonate at the desired resonance frequency with an acceptable level of matching (≤−15 dB). Panel (b) of FIG. 22 also demonstrates that the lowest value of $\lambda_{av}$ for the manufactured TxArray coil is 0.33, which is attained at 123.2 MHz. This value is 0.1 greater than the same value in the simulation, but for the manufactured TxArray coil, it is still the lowest available value of $\lambda_{av}$.

Figure 23:
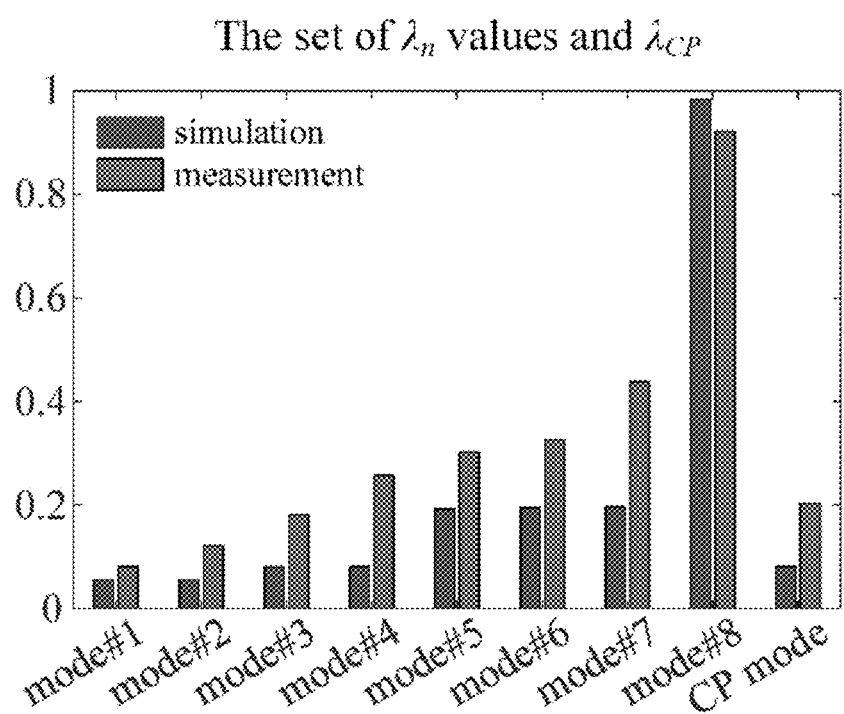
FIG. 23 depicts the simulated and measured eight $\lambda_n$ values and $\lambda_{CP}$ for the updated 8-channel TxArray coil at 123.2 MHz.

FIG. 23 depicts the measured λ values at 123.2 MHz for the fine-tuned fabricated TxArray coil and compares them with the simulated λ values. For both simulated and manufactured TxArray coils, only one excitation eigenmode, i.e., the eigenvector of $S^H S$, has a high modal reflected power (>0.92). This mode, therefore, hardly contributes to the process of transmission. For the simulated TxArray coil, seven excitation eigenmodes have a total reflection of less than 20%. The manufactured TxArray coil, on the other hand, has seven excitation eigenmodes with a maximum total reflection of less than 44%. The normalized reflected power in the CP excitation mode for the simulated and manufactured TxArray coils are 0.08 and 0.2, respectively. In the fine-tuning process of the manufactured TxArray coil, it has been possible to minimize $\lambda_{CP}$ more, although this has increased $\lambda_{av}$.

Figure 24:
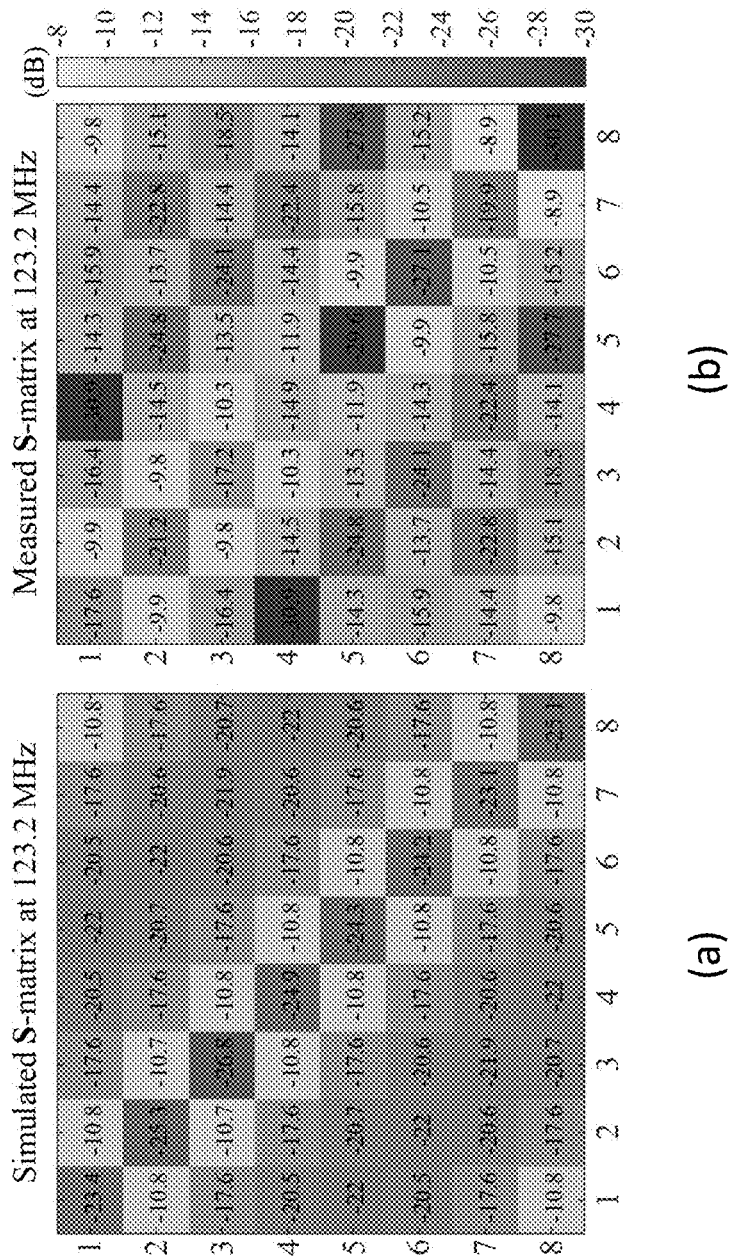
FIG. 24 compares (a) simulated and (b) measured S-matrices of the updated 8-channel TxArray coil at 123.2 MHz.

The S-matrices of the simulated and fine-tuned manufactured 8-channel TxArray coil at 123.2 MHz are presented in FIG. 24. For the simulated and manufactured TxArray coil, the maximum coupling was −10.7 dB and −8.9 dB, respectively, which occurred between the adjacent channels. For non-adjacent channels, the maximum coupling was −17.6 dB and −13.5 dB for the simulated and manufactured TxArray coils, respectively. The maximum difference in the matching and coupling levels are −13.3 dB and −6.8 dB, respectively, which is lower than the initial error. Note that in the second iteration, only the cost function written in Equation (7) at 123.2 MHz was minimized, and no attempt was made to reduce the difference between the simulated and measured S-matrices.

FIGS. 22-24 demonstrate that through the iteration, the fabricated TxArray coils can perform as designed and optimized based on simulation results even with some imperfection or tolerances during the manufacturing.

The present teachings provide a practical and effective approach based on modeling of manufactured TxArray coils using distributed lumped-elements to design and fabricate TxArray coils. In this approach, the coil's structure can first be simulated in a commercial EM solver to determine the most optimal values for the coil's free parameters in the simulation environment. By assembling the optimum lumped elements and measuring the impedance (scattering) matrix of the fabricated coil in a wide frequency range and analyzing its equivalent circuit model, it is possible to predict unknown parameters of the circuit model as a function of frequency, including coil's inductances and resistances. Whenever the equivalent inductances and resistances are determined, the free design parameters can be optimized again to design the fabricated an improved TxArray coil.

In developing diagnostic magnetic resonance imaging, the conventional birdcage resonator has played an important role. For whole-body imaging at 1.5T and a wide range of other frequencies, birdcage coil has been recognized as an efficient and highly homogenous RF resonator. Applying a high-frequency uniform field from the outside of a sample with a high dielectric constant such as tissue can produce an inhomogeneous $B_1^+$ field inside the sample. A more uniform $B_1^+$ field can be achieved within the sample by using TxArray coils by implementing a non-uniform external field. For example, a non-uniformity of less than about 20% can be achieved by practicing the present teachings, where non-uniformity can defined, e.g., in a manner discussed above. In some embodiments, a TxArray coil according to the present teachings can be achieve a level of uniformity for $B_1^+$ field that is comparable to that provided by a typical birdcage coil. TxArray coils have been investigated in many types, and each has its advantages and drawbacks. They can be categorized as follows: loop-based designs with various kinds of inter-element decoupling components, microstrip-based designs with or without inter-element decoupling components, dipole-based designs, and combinations thereof. The selection of the suitable TxArray coil design must take account of both theoretical and practical factors imposed by the application goal. The birdcage-like TxArray coils are intrinsically more efficient among loop-based models because of the shared conductors between the adjacent meshes. In the loop-based non-birdcage TxArray coils, the currents flow in both directions of the two adjacent loop conductors. In contrast, these currents are combined in the birdcage-like TxArray coils, leading to a reduced current along the shared path formed by the rungs of birdcage-like TxArray coils and hence increased efficiency of the coil.

As described above, in the present disclosure, the performance of a shielded 8-channel head TxArray coil was investigated at 123.2 MHz together with simulation and experiment to validate the method. It is expected that a TxArray coil according to various embodiments can substitute conventional body coils in MRI systems. The coil performance, if it is driven in the circularly polarized (CP) mode, is comparable to the traditional birdcage coils. Still, the coil can also provide extra flexibility for a wide range of useful TxArray coils applications. In embodiments of the present teachings, a degenerate birdcage TxArray coil is described, and a special case of birdcage-like TxArray coils is presented where the capacitor values are adjusted to collapse all resonating modes to a single (degenerate) frequency.

The coil was appropriately simulated and designed using the co-simulation strategy, then it was manufactured by assembling the optimum lumped-elements obtained from the simulation. The results indicated that the measured and simulated S-matrices are not matched with each other initially. However, fine-tuning and matching of the capacitor values were demonstrated to be capable of reducing the mismatch between simulation and measurement. Through this process, iterative tuning and matching of all transmit channels can be achieved.

Referring back to FIG. 1, a TxArray coil in accordance with the present teachings can be incorporated in an MRI system as schematically depicted in FIG. 1. Components of the MRI system other than the RF coil 26 will be describe below.

The gantry 20 may block electromagnetic waves generated by a main magnet 22, a gradient coil 24, an RF coil 26, etc. from being radiated to the outside. The gantry 20 may include a bore therein. An electromagnetic field and a gradient magnetic field may be formed in the bore and an RF signal may be irradiated from the bore toward an object 10. The main magnet 22, the gradient coil 24, and the RF coil 26 may be disposed in a predetermined direction of the gantry 20. The predetermined direction may include a coaxial cylindrical direction, or the like. The object 10 may be positioned on a table 28 insertable into a cylinder along a horizontal axis of the cylinder.

The main magnet 22 may generate a static magnetic field for aligning a magnetic dipole moment of the atomic nuclei included in the object 10 in a predetermined direction. As the magnetic field generated by the main magnet is stronger and more uniform, a relatively precise and accurate MR image with respect to the object 10 may be obtained.

The gradient coil 24 may include X, Y, and Z coils that generate a gradient magnetic field in mutually orthogonal X-, Y-, and Z-axis directions. The gradient coil 24 may provide positional information of each part of the object 10 by inducing resonance frequencies differently for each part of the object 10.

Further, a display 29 may be positioned outside the gantry 20, and another display (not illustrated) may be positioned inside the gantry 20. Predetermined information may be provided to the user or the object via the displays positioned inside and outside of the gantry 20.

The signal transceiver unit 30 may control a gradient magnetic field formed in the gantry 20 according to a predetermined MR sequence and control transmission and reception of the RF signal and the magnetic resonance signal. The signal transceiver unit 30 may include a gradient amplifier 32, a transceiver switch 34, an RF transmitting unit 36, and an RF receiving unit 38.

The gradient amplifier 32 may drive the gradient coil 24 included in the gantry 20 and supply a pulse signal for generating the gradient magnetic field to the gradient coil 24 under the control of the gradient magnetic field control unit 24. The gradient magnetic field control unit 54 may control the pulse signal supplied from the gradient amplifier 32 to the gradient coil 24. By controlling the pulse signal supplied to the gradient coil 24, the gradient magnetic fields in X-axis, Y-axis, and Z-axis directions may be synthesized. The pulse signal may be implemented by current.

The transceiver switch 34 may adjust transmission/reception directions of the RF signal and the magnetic resonance signal. For example, the transceiver switch 34 may cause the RF signal to be irradiated to the object 10 through the RF coil 26 during a transmission mode and the magnetic resonance signal from the object 10 through the RF coil 26 to be received during a reception mode. The transceiver switch 34 may be controlled by a control signal from an RF control unit 56.

The monitoring unit 40 may monitor or control the gantry 20 or devices mounted on the gantry 20. The monitoring unit 40 may include a system monitoring unit 42, an object monitoring unit 44, a table control unit 46, and a display control unit 48.

The system monitoring unit 42 may monitor and control a state of the static magnetic field, the state of the gradient magnetic field, the state of the RF signal, the state of the RF coil, the state of a table, the state of a device for measuring body information of the object, a power supply state, the state of a heat exchanger, the state of a compressor, and the like.

The object monitoring unit 44 may monitor the state of the object 10. For example, the object monitoring unit 44 may include a camera for observing a motion or a position of the object 10, a respiration measuring unit for measuring respiration of the object 10, an ECG measurer for measuring an electrocardiogram of the object 10, or a body temperature measurer for measuring a body temperature of the object 10.

The table control unit 46 may control movement of the table 28 at which the object 10 is positioned. The table control unit 46 may control the movement of the table 28 according to sequence control of the sequence control unit 50. For example, in moving imaging of the object, the table control unit 46 may continuously or intermittently move the table 28 according to the sequence control by the sequence control unit 50 to thereby photograph the object in a field of view (FOV) larger than the FOV of the gantry 20.

The display control unit 48 may control the displays positioned outside and inside the gantry 20. For example, the display control unit 48 may control on/off of the displays positioned outside and inside the gantry 20 or a screen to be output to the display. Further, when a speaker is positioned inside or outside the gantry 20, the display control unit 48 may control the on/off of the speaker or a sound to be output through the speaker.

The system control unit 50 may include a sequence control unit 52 for controlling a sequence of signals formed in the gantry 20 and a gantry control unit 58 for controlling the devices mounted on the gantry 20.

The sequence control unit 52 may include the gradient magnetic field control unit 54 for controlling the gradient amplifier 32 and the RF control unit 56. The RF control unit 56 may control the RF transmitting unit 36, the RF receiving unit 38, and the transceiver switch 34. The sequence control unit 52 may control the gradient amplifier 32, the RF transmitting unit 36, the RF receiving unit 38, and the transceiver switch 34 according to a pulse sequence received from the operating unit 60. Here, the pulse sequence may include all information required for controlling the gradient amplifier 32, the RF transmitting unit 36, the RF receiving unit 38, and the transceiver switch 34 and may include, for example, information on the intensity, an application time, an application timing, and the like of the pulse signal applied to the gradient coil 24.

The operating unit 60 may instruct the pulse sequence information to the system control unit 50 and control an operation of the entire MRI apparatus. The operating unit 60 may include an image processing unit 62 for processing the magnetic resonance signal received from the RF receiving unit 38, an output unit 64, and an input unit 66.

The image processing unit 62 processes the magnetic resonance signal received from the RF receiving unit 38 to generate magnetic resonance image data for the object 10. The image processing unit 62 may perform various signal processing such as amplification, frequency conversion, phase detection, low frequency amplification, filtering, and the like on the magnetic resonance signal received by the RF receiving unit 38. The image processing unit 62 arranges digital data in k-space data (also referred to as, for example, a Fourier space or a frequency space) of a memory and performs two-dimensional or three-dimensional Fourier transformation of the data to reconfigure the data into image data. Further, the image processing unit 62 may perform synthesis processing or difference arithmetic processing of the image data as necessary. The synthesis processing may include addition processing for a pixel, maximum value projection (MIP) processing, and the like. Further, the image processing unit 62 may store not only the reconfigured image data but also the image data subjected to the synthesis processing or the difference arithmetic processing in a memory (not illustrated) or an external server. In addition, various signal processing applied to the magnetic resonance signal by the image processing unit 62 may be performed in parallel. For example, a plurality of magnetic resonance signals may be reconfigured into the image data by applying signal processing in parallel to the plurality of magnetic resonance signals received by a multi-channel RF coil.

The output unit 64 may output the image data or the reconfigured image data generated by the image processing unit 62 to the user. In addition, the output unit 64 may output information required for the user to operate the MRI apparatus, such as a UI (user interface), user information, or object information. The output unit 64 may include a speaker, a printer, a CRT display, an LCD display, a PDP display, an OLED display, an FED display, an LED display, a VFD display, a DLP display, a PFD display, a 3D display, a transparent display, and the like and may include a variety of output devices within other scopes which are apparent to those skilled in the art.

The user may input object information, parameter information, a scan condition, the pulse sequence, information on image synthesis and calculation of difference, and the like using the input unit 66. The input unit 66 may include a keyboard, a mouse, a trackball, a voice recognition unit, a gesture recognition unit, a touch screen, and the like and may include various input devices within the other scopes which are apparent to those skilled in the art.

As described above, FIG. 1 illustrates the signal transceiver unit 30, the monitoring unit 40, the system control unit 50, and the operating unit 60 as separate objects. However, the present teachings are not limited thereto, and one of ordinary skill in the art will be able to appreciate that functions performed by the signal transceiver unit 30, the monitoring unit 40, the system control unit 50, and the operating unit 60, respectively may be performed in different objects. For example, it is described above that the image processing unit 62 converts the magnetic resonance signal received by the RF receiving unit 38 into a digital signal, but the conversion into the digital signal may be autonomously performed by the RF receiving unit 38 or the RF coil 26.

The gantry 20, the RF coil 26, the signal transceiver unit 30, the monitoring unit 40, the system control unit 50, and the operating unit 60 may be connected to each other wirelessly or by wire and may further include a device (not illustrated) for synchronizing clocks with each other when the gantry 20, the RF coil 26, the signal transceiver unit 30, the monitoring unit 40, the system control unit 50, and the operating unit 60 are connected to each other wirelessly.

As communication among the gantry 20, the RF coil 26, the signal transceiver unit 30, the monitoring unit 40, the system control unit 50, and the operating unit 60, a high-speed digital interface such as low voltage differential signaling (LVDS), or the like, asynchronous serial communication such as universal asynchronous receiver transmitter (UART), false synchronization serial communication, a low-latency type network protocol such as a controller area network (CAN), or the like, an optical communication, or the like may be used and various communication methods may be used in the scope which is apparent to one of ordinary skill in the art.

What is claimed is:

1. A method of manufacturing a coil array for use in a magnetic resonance imaging (MRI) system, comprising:
   determining a normalized reflected power generated by coils in the coil array in response to excitation thereof via at least one excitation signal, wherein the coils of the first coil array collectively possess at least two excitation eigenmodes; and
   adjusting one or more parameters of at least one of the coils so as to minimize the normalized reflected power for the at least two excitation eigenmodes, thereby arriving at design values for the parameters.

2. The method of claim 1, wherein the normalized reflected power is determined as a function of the at least one excitation signal and a scattering matrix (S) associated with the coil array.

3. The method of claim 1, wherein the at least one excitation signal comprises an excitation vector comprising one or more excitation signals, wherein each of the one or more excitation signals is associated with excitation of one coil of the coil array.

4. The method of claim 3, further comprising expanding the excitation vector as a linear combination of excitation eigenmodes of the coil array.

5. The method of claim 4, further comprising determining, for each of the excitation eigenmodes, a modal reflected power value.

6. The method of claim 5, wherein determining the normalized reflected power comprises computing a weighted sum of the modal reflected power values.

7. The method of claim 5, wherein the one or more parameters are adjusted so as to increase a number of excitation eigenmodes that produces the modal reflected power value equal to or less than about 50%.

8. The method of claim 1, further comprising fabricating the coil array based on the design values of the parameters.

9. The method of claim 8, further comprising:
   applying the excitation signal to the coil array to generate a magnetic field;
   directing the magnetic field on an object so as to allow the magnetic field to excite protons in the object; and
   detecting resulting excitation radio frequency (RF) from the object.

10. The method of claim 1, wherein the step of adjusting one or more parameters includes adjusting capacitor values of the coils and thus determining a capacitance matrix of the coil array.

11. A method of fabricating a coil array for use in a magnetic resonance imaging (MRI) system, comprising:
   a) determining a first set of parameters for a first coil array, wherein coils of the first coil array collectively generate at least two excitation eigenmodes, wherein the first set of parameters are determined so as to minimize a normalized reflected power for the at least two excitation eigenmodes generated by the coils in the first coil array in response to excitation thereof via at least one excitation signal, wherein the normalized reflected power for two or more excitation eigenmodes are minimized;
   b) fabricating the first coil array based on the first set of parameters;
   c) measuring impedance values and constructing a first impedance matrix associated with the first coil array for one or more frequencies;

d) obtaining a first scattering matrix (S) associated with the first coil array; and e) minimizing a first cost function for the first coil array by adjusting capacitor values of the coils and obtaining a second set of parameters for a second coil array.

12. The method of claim 11, further comprising:

f) fabricating the second coil array based on the second set of parameters.

13. The method of claim 12, wherein the steps c) through f) are repeated more than one time.

14. The method of claim 11, further comprising:

applying at least one excitation signal to the coil array to generate a magnetic field;

directing the magnetic field on an object so as to allow the magnetic field to excite protons in the object; and detecting resulting excitation radio frequency (RF) from the object.

15. The method of claim 11, wherein the first cost function is selected from the group consisting of:

$$\min_{\bar{c}} \frac{1}{N} \sum_{n=1}^{N} \lambda_n^2 + \lambda_{CP}^2,$$

$$\min_{\bar{c}} \frac{1}{N} \sum_{n=1}^{N} \lambda_n^2 + \lambda_{CP}^2$$

s.t. $\lambda_{CP} \leq 0.01$, and $$\min_{\bar{c}} \frac{1}{N} \sum_{n=1}^{N} \lambda_n^2,$$

wherein, the $\bar{c}$ value is a vector of capacitor values;
the N value is a total number of channels;
the $\lambda_n$ value is a vector of excitation eigenmodes; and
the $\lambda_{CP}$ value is a vector of CP excitation.

16. A transmit coil array for use in a magnetic resonance imaging (MRI) system, comprising:

one or more coils;

one or more capacitors disposed between adjacent coils of the one or more coils; and a power supply configured to supply electrical power to the one or more coils, wherein the one or more capacitors are configured to reduce inductive coupling between the coils, wherein the one or more coils collectively possess at least two excitation eigenmodes, and wherein the transmit coil array is made by a process of:

adjusting one or more parameters of at least one coil of the one or more so as to minimize the normalized reflected power for the at least two excitation eigenmodes.

17. The transmit coil array of claim 16, wherein the one or more capacitors comprise:

a decoupling capacitor configured to decouple neighboring coils;
a tuning capacitor;
a matching capacitor; and
a series matching capacitor.

18. The transmit coil array of claim 16, wherein one or more parameters of the coils are configured such that a ratio of a total power reflected to a total power applied is minimized.

19. The transmit coil array of claim 18, wherein the coil array includes n channels and is configured to transmit m modes efficiently, and wherein then value is greater than the m value.

20. The transmit coil array of claim 16, wherein the parameters of the coils are optimized for a circularly-polarized (CP) mode by adjusting a vector of capacitor values to minimize a cost function:

$$\sum_{n=1}^{N} (\alpha_n \lambda_n^2) + \alpha_{CP} \lambda_{CP}^2$$

wherein, the N value is a total number of channels;
the $\lambda_n$ value is a vector of excitation eigenmodes;
the $\lambda_{CP}$ value is a vector of CP excitation; and
the $\alpha_n$ value and the $\alpha_{CP}$ value are weights for each term.

21. The transmit coil array of claim 20, wherein the $\alpha_n$ value is 1, and the $\alpha_{CP}$ value is 0 or 1.

22. The transmit coil array of claim 20, wherein elements of the $\lambda_{CP}$ value are limited to 0.01 or less.

23. The transmit coil array of claim 16, further comprising a radio frequency (RF) detector for detecting excitation radio frequency (RF) from an object.

24. The transmit coil array of claim 16, wherein the coil array is fabricated by following steps of:

fabricating a prototype coil array based on the one or more parameters;

measuring impedance values and constructing an impedance matrix associated with the prototype coil array for one or more frequencies;

obtaining a scattering matrix (S) associated with the prototype coil array;

minimizing a cost function for the prototype coil array by adjusting capacitor values of the coils and obtaining a new set of one or more parameters; and fabricating the coil array in accordance with the new set of one or more parameters.

25. A method of creating a coil array design of a coil array for use in a magnetic resonance imaging system, comprising:

determining a normalized reflected power generated by coils in the coil array in response to excitation thereof via an excitation vector comprising one or more excitation signals;

adjusting one or more parameters of the coil array design for at least one coil of the coils so as to minimize the normalized reflected power and to arrive at design values for the parameters, wherein each excitation signal of the one or more excitation signals is associated with excitation of a respective coil of the coil array; and causing the coil array to be fabricated based on the one or more parameters, wherein the normalized reflected power is determined by expanding the excitation vector as a linear combination of excitation eigenmodes of the coil array.

* * * * *